(12) United States Patent
Fujimoto et al.

(10) Patent No.: US 7,385,231 B2
(45) Date of Patent: Jun. 10, 2008

(54) POROUS THIN-FILM-DEPOSITION SUBSTRATE, ELECTRON EMITTING ELEMENT, METHODS OF PRODUCING THEM, AND SWITCHING ELEMENT AND DISPLAY ELEMENT

(75) Inventors: Kiyoshi Fujimoto, Ashigarakami-gun (JP); Masakazu Nakamura, Chiba (JP)

(73) Assignee: FujifilmCorporation, Minato-Ku, Tokyo (JP)

( * ) Notice: Subject to any disclaimer, the term of this patent is extended or adjusted under 35 U.S.C. 154(b) by 0 days.

(21) Appl. No.: 11/513,223

(22) Filed: Aug. 31, 2006

(65) Prior Publication Data
US 2007/0049047 A1  Mar. 1, 2007

(30) Foreign Application Priority Data

| | | |
|---|---|---|
| Aug. 31, 2005 | (JP) | 2005-252450 |
| Aug. 31, 2005 | (JP) | 2005-252513 |
| Aug. 31, 2005 | (JP) | 2005-252518 |
| Sep. 16, 2005 | (JP) | 2005-271184 |
| Sep. 16, 2005 | (JP) | 2005-271190 |
| Sep. 16, 2005 | (JP) | 2005-271192 |

(51) Int. Cl.
*H01L 29/74* (2006.01)
(52) U.S. Cl. ............ 257/121; 257/212; 257/274; 257/369; 257/E27.148; 257/E31.072; 977/938; 315/39.57; 310/304; 313/377; 430/311; 438/612
(58) Field of Classification Search ............ None
See application file for complete search history.

(56) References Cited

U.S. PATENT DOCUMENTS 6,846,616 B2 * 1/2005 Kobayashi et al. ......... 430/311

2006/0204901 A1 * 9/2006 Shimizu .................... 430/321

FOREIGN PATENT DOCUMENTS

JP  5-97598 A  4/1993

(Continued)

OTHER PUBLICATIONS

Kudo et al., "Organic Static Induction Transistor for Color Sensors", Synthetic Metals, 1999, pp. 900-903, vol. 102, Elsevier Science S.A.

(Continued)

*Primary Examiner*—A. Sefer
*Assistant Examiner*—Scott R Wilson
(74) *Attorney, Agent, or Firm*—Buchanan Ingersoll & Rooney PC

(57) ABSTRACT

A method of producing a porous thin-film-deposition substrate, which has the steps of: placing onto a substrate that has an electrostatic charge on its surface, fine particles with a surface electrostatic charge opposite to the electrostatic charge of the substrate surface, depositing a thin film on the fine-particle-placed substrate, and then removing the fine particles to form fine pores in the thin film; further, a method of producing an electron emitting element, which has the steps of: adding a catalyst metal on a substrate, placing fine particles onto the catalyst-added substrate, depositing a thin film on the fine-particle-placed substrate, then removing the fine particles to form fine pores in the film, and growing needle-shaped conductors on the catalyst metal that is exposed on a bottom face of the fine pore.

24 Claims, 31 Drawing Sheets

FOREIGN PATENT DOCUMENTS

| | | |
|---|---|---|
| JP | 7-221344 A | 8/1995 |
| JP | P2000-203998 A | 7/2000 |
| JP | P2000-284136 A | 10/2000 |
| JP | P2000-340485 A | 12/2000 |
| JP | P2001-57146 A | 2/2001 |
| JP | P2001-91777 A | 4/2001 |
| JP | P2001-96499 A | 4/2001 |
| JP | P2001-102381 A | 4/2001 |
| JP | P2001-141633 A | 5/2001 |
| JP | P2001-153738 A | 6/2001 |
| JP | P2001-167692 A | 6/2001 |
| JP | P2001-177052 A | 6/2001 |
| JP | P2001-189466 A | 7/2001 |
| JP | P2002-220300 A | 8/2002 |
| JP | P2002-277659 A | 9/2002 |
| JP | P2004-12283 A | 1/2004 |

OTHER PUBLICATIONS

Hanarp et al., "Control of Nanoparticle Film Structure for Colloidal Lithography", Colloids and Surfaces A: Physicochem. Eng. Aspects, 2003, pp. 23-36, vol. 214, Elsevier Science B.V.

Werdinius et al., "Nanofabrication of Planar Model Catalysts by Colloidal Lithography:Pt/Ceria and Pt/Alumina", Langmuir, 2003, pp. 458-468, vol. 19, American Chemical Society.

Muraishi et al., "Fabrication of Organic Nano-SIT Using Conductive AFM Cantilevers", Shingaku Giho, 2002, pp. 13-17, vol. 15.

Prikulis et al., "Optical Spectroscopy of Nanometric Holes in Thin Gold Films", Nano Letters, Jun. 2004, pp. 1003-1007, vol. 4, No. 6, American Chemical Society.

Denis et al., "Nanoscale Chemical Patterns Fabricated by Using Colloidal Lithography and Self-Assembled Monolayers", Langmuir, 2004, pp. 9335-9339, vol. 20, American Chemical Society.

\* cited by examiner

POROUS THIN-FILM-DEPOSITION SUBSTRATE, ELECTRON EMITTING ELEMENT, METHODS OF PRODUCING THEM, AND SWITCHING ELEMENT AND DISPLAY ELEMENT

FIELD OF THE INVENTION

The present invention relates to a porous thin-film-deposition substrate having a fine structure, to a method of producing the same, and to a switching element. Further, the present invention relates to an electron emitting element (hereinafter also referred to as "field emitter element"), to a method of producing the same, and to a display element. Further, in detail, the present invention relates to a method of producing various elements efficiently at low costs, the method utilizing a thin film or a laminate film having fine pores formed on a substrate by using fine particles as a shadow mask, e.g., to grow an aggregate of microcrystals, such as a needle-like conductor (for example, nanowire and whisker) on a catalyst metal on the bottom face of the fine pores.

BACKGROUND OF THE INVENTION

Display devices such as liquid crystal displays and electroluminescence (EL) displays are provided with switching elements arranged matrix-wise on a substrate such as a glass substrate. The displays form a display pattern on an image plane by selectively driving thin film transistors (TFT) and pixel electrodes with switching elements. For example, in active matrix-type liquid crystal display devices, an array substrate is formed with TFTs, pixel electrodes and wiring which supplies signals to these parts, the substrate is disposed opposite to a counter substrate having counter electrodes, and a liquid crystal is sealed between such substrates.

As such a switching element for display devices, TFTs using silicon as the active layer have been used so far. However, a chemical vapor deposition growth (CVD) step is necessary to form the silicon thin film, which is a significant cause inhibiting reduction in production costs. Also, as the substrate, a glass substrate is usually used. However, a glass substrate is less resistant to impact and tends to break. It is proposed to use a polymer film as a substrate to cope with problems concerning the breakdown of a substrate and with the development of light-weight and flexible display devices. However, the polymer film is considerably inferior to a glass substrate in heat resistance and is unsuitable to a process of producing a silicon TFT. In light of this, studies are being made as to switching devices using, as the active layer, an organic semiconductor that can be formed at low temperatures in an inexpensive process.

Also, the mobility of carriers in an organic semiconductor is the same as or lower than that in amorphous silicon, and therefore only insufficient ON-current value is obtained. The mobility of carriers in an organic semiconductor is not sufficient to drive, particularly, a current drive-type display device such as EL displays.

There is a static induction transistor (SIT) as a switching element by which a relatively preferable ON current value is obtained even if the mobility is low. SITs are vertical transistors in which current flows in the direction of the thickness of the film and are different from usual TFTs which are horizontal types in which current flows in the direction of the sheet of the active layer. FIG. 29 is a schematic sectional view showing the general structure of a SIT. SITs generally have structures similar to those of tripods, provided on a substrate 101, in which a sheet-like gate electrode 104 formed with a large number of through-holes 108 (hereinafter called "slit" or "gate hole") are interposed between a pair of parallel plate type electrodes each constituted of a source electrode 103 and a drain electrode 102. Semiconductor layers 105a and 105b are filled between these parallel plate electrodes and the gate hole. When voltage is applied across the gate electrode 104, a depletion layer is formed in the semiconductor layers 105a and 105b penetrating the gate hole, whereby current can be controlled.

In order to sufficiently reduce the low driving voltage and the OFF-current value in SITs using an organic semiconductor as the active layer, it is necessary to control current also in a thin depletion layer. It is therefore necessary to make the gate hole small-sized. Specifically, because organic semiconductors generally have more insufficient carrier mobility than inorganic semiconductors, the density of a dopant must be higher in order to obtain a sufficient ON-current value. When the density of a dopant is high, the depletion length of a depletion layer is shorter even under the same voltage. Therefore, it is necessary to decrease the hole diameter of the gate hole to 10 μm or less, though it depends on the concentration of a dopant in the case of SITs using an organic semiconductor as the active layer.

However, the diameter of the gate hole which can be manufactured by a lithographic process which is usually used in the production of a flat panel display such as a liquid crystal display and is carried out at relatively low costs and a low resolution is about several μms. Therefore, if it is intended to form a gate hole having a diameter of 10 μm or less precisely, high costs are necessitated. Also, there is the problem that the organic semiconductor layer is deteriorated in the step of peeling resists and metal films in the case of using a lithographic process using a current resist polymer on the organic semiconductor layer which has been already formed.

An attempt is made to use a discontinuous film that is thinly vapor-deposited as the gate electrode in SITs using an organic semiconductor as the active layer (see Kudo et al., "Synthetic Metals," 1999, vol. 102, pp 900-903). However, the sizes of pores in the formed porous structure are not uniform and it is therefore difficult to obtain good switching characteristics. Moreover, the porous structure of the gate electrode is greatly changed according to the vapor deposition condition. It is therefore difficult to keep the characteristics of each element at a fixed level in the case of a switching element array for a display which array must be formed collectively on a substrate having a large area.

To solve this problem, a method is proposed in which a polymer film having a micro-phase isolated structure is used as an etching mask used to produce a gate electrode (see the publication of JP-A-2001-189466, JP-A means unexamined published Japanese patent application). However, it is difficult to prepare the polymer film having the micro-phase isolated structure suitable to the process. This method has also many steps and it is difficult to say that this process is an inexpensive one.

Moreover, an attempt is made to stick microparticles to a substrate. However, because this method is unsatisfactory in the stability of the stuck microparticles, and is therefore assumed to be unsuitable to utilization as alternate technologies for semiconductor lithography, it has yet to be applied to semiconductor manufacturing (see P. Hanarp et al., Colloid and Surfaces, Physicochem. Eng. Aspects 214 (2003) 23-26). There is an example in which microparticles are used as a shadow mask in a vapor deposition process to carry out film formation or etching (see C. Wedinius et al., Langmuir, 2003, 19. pp. 458-468) and another example in which a device having pores is formed (see Muraishi et al., "Shingaku Giho," 2002, Vol. 15, pp. 13-17). It is however difficult to obtain a sufficient ON-current value by the element structure disclosed here.

On the other hand, along with the development of nanotechnologies, a method of producing fine structures having nano-size by using super-fine processing technologies has been developed. Methods of producing a resist pattern (so-called photolithography) by using electron rays or exposure to light are known as typical methods of producing dot patterns or line patterns to arrange nano-size fine structures regularly on a substrate.

FIG. 30 is a diagram showing a conventional method thereof. This method includes the following process: A resist layer 902 is applied to the surface of a substrate 901 (step I), an exposure resist layer 902a part of the resist layer 902 is exposed to a transmission light 906 through a photomask 903 (step II), then, a resist layer 902b patterned by developing is formed (step III), a catalyst metal 904 such as gold and platinum is vapor-deposited on the resist layer 902b (step IV), and then, the patterned resist layer 902b is lifted off. By this process, a patterned catalyst metal 904a is stuck to and remains on the surface of the substrate 1 (step V). After that, a fine structure 905a is formed on the substrate 901 and is made to grow into a structure like a fine structure 905b (step VI) by using a whisker crystal growth method, such as a chemical vapor phase growth (CVD) method or a molecular beam epitaxy (MBE) method, using a catalyst metal.

Whisker crystals have, for example, a diameter of about 1.0 to 100 nm and a length of about 0.5 to 100 μm, and they are also called nanoscale conductor or nanowire. One known method of growing whiskers, for example, is a VLS method utilizing a VLS (Vapor-Liquid-Solid) mechanism by using metal microparticles as a catalyst, which is a phenomenon that occurs at a vapor-phase-vapor phase or liquid phase-solid phase boundary.

A method of growing whisker crystals under control and an example in which this method is applied to the production of a sharp point small cathode are disclosed in each publication of JP-A-5-97598, JP-A-7-221344 and JP-A-2002-220300 is disclosed. In this method, an opening is formed by etching in a silicon oxide ($SiO_2$) film formed on a substrate made of silicon and, for example, gold or gallium microparticles are stuck as a catalyst metal to the opening and then heated to grow silicon oxide ($SiO_2$) or silicon (Si) whisker crystals. For industrial utilization of these whiskers, studies are being made concerning field emission devices, ultrasonic wave vacuum-tube amplifiers, display devices (see, for example, each publication of JP-A-2001-57146 and JP-A-2001-96499), nanoscale conductive connectors (see, for example, the publication of JP-A-2001-102381), touch sensors (see, for example, the publication of JP-A-2001-153738), micro-interconnecting circuit devices (see, for example, each publication of JP-A-2001-141633 and JP-A-2001-177052) and emitter structures (see, for example, the publication of JP-A-2001-167692).

Moreover, an example in which a metal film of about micron size on a sapphire substrate by a resist pattern and an aggregate of zinc oxide (ZnO) whisker microcrystals is grown in a direction perpendicular to the substrate (see M. H. Huang et al., "Science," Vol. 292, 1897, 2001); an example in which a titanium oxide whisker is grown by heat treatment (see the publication of JP-A-2000-203998), and a method in which a nano-indenter that is a supermicrohardness meter is used to form a dot pattern to grow crystals from these dot patterns (the publication of JP-A-2004-12283), are known.

However, in these methods, it is difficult to arrange individual whisker crystals regularly on the substrate with maintaining each have a fine shape. These methods therefore can not be applied to electronic devices including electron emitting element.

Besides these methods in which microcrystals are grown on the substrate, other known methods of producing photonic crystals are a method in which holes formed by fine processing are used as dies to insert a thin film into these holes (see the publication of JP-A-2000-284136), a method in which a liquid polymer is cast (see the publication of JP-A-2001-91777), and a method in which a liquid polymer is filled (see the publication of JP-A-2002-277659). In recent years, a fine processing method has come to be known in which a resist is patterned using a scanning probe microscope as fine processing methods used in place of an electron ray or light exposure method (see the publication of JP-A-2000-340485).

However, these methods are unsatisfactory in the points of micronization and control of a device structure. Although an attempt is made to control a growth point, at least, devices having significantly high accuracy are required. Therefore, these methods unsuitable to industrial production, cannot be adopted.

Needle-like conductors such as whisker microcrystals are expected to be applied, particularly, to field emitters (also referred to simply as "emitter"). This is because the sharp end forms of these needle-like conductors are considered to be suitable to an emitter that emits electrons by applying a strong field to silicon or a metal tip. In addition, a fluorescent screen can be made to shine by making these emitted electrons run against the screen and therefore, these needle microcrystals are expected to be applied and developed widely in the fields of flat panel displays.

In this regard, the currently used field emitters are produced by making silicon or a metal have a sharp edge by processing it and the diameter of the end point is therefore as large as 20 to 30 nm. Electrons can only be emitted if a voltage close to or more than 100 V is applied. Also, the end points of sharp silicon and a metal are produced at a low yield, posing a large problem.

As materials used to solve this problem, studies are being made concerning the use of a carbon nanotube having a fine structure with a diameter as small as 1 to 10 nm. This reason is that the carbon nanotube is suitable for applications to field emitters. However, it is very difficult to handle this carbon nanotube and it is also difficult to selectively dispose it at necessary positions because of its too fine structure. After all, a method as primitive as mixing many nanotubes in glue, and applying the mixed glue to a substrate, is presently used. In this method, it is difficult to control the device structure exactly, and it is necessary to apply a voltage of 100 V or more to emit electrons.

SUMMARY OF THE INVENTION

The present invention resides in a method of producing a porous thin-film-deposition substrate, which has the steps of: placing, onto a substrate that has an electrostatic charge on its surface, fine particles with a surface electrostatic charge opposite to the electrostatic charge of the substrate surface, depositing a thin film, including at least one layer, on the fine-particle-placed substrate, and then removing the fine particles to form fine pores in the thin film on the substrate; if necessary, with sticking an adhesive sheet onto the thin film deposited on the fine-particle-placed substrate, and peeling the adhesive sheet for removing the fine particles to leave the fine pores in the film layer.

Further, the present invention resides in a porous thin-film-deposition substrate produced in accordance with the above-described method, and a switching element has the porous thin-film-deposition substrate and another thin film formed thereon.

Still further, the present invention resides in a method of producing an electron emitting element, which has the steps of: adding a catalyst metal on a substrate, placing fine particles onto the catalyst-added substrate, depositing a thin film, including at least one layer, on the fine-particle-placed substrate, then removing the fine particles to form fine pores in the film, and growing needle-shaped conductors as an aggregate thereof on the catalyst metal that is exposed on a bottom face of the fine pore.

Moreover, the present invention resides in an electron emitting element has: a substrate with at least one layer of a base film formed thereon, another thin film layer, formed on the base film, having fine pores arranged substantially at an equal interval, and an aggregate of needle-shaped conductors formed on each bottom face of the fine pores, wherein the fine pores of the film layer are formed by removing fine particles from the substrate, in that the fine particles are once placed onto the surface of the base film on the substrate in accordance with a dipping adsorption method, and then the film layer is deposited on the fine-particle-placed substrate; and a display element has the above-described electron emitting element.

Other and further features and advantages of the invention will appear more fully from the following description, appropriately referring to the accompanying drawings.

BRIEF DESCRIPTION OF THE DRAWINGS

FIG. 6-1 is a partial sectional view schematically showing the structure of a SIT (1) as an example of a switching element of the present invention.

FIG. 6-2 is a partial sectional view along the line VI-VI in FIG. 6-1.

DETAILED DESCRIPTION OF THE INVENTION

Figure 1:
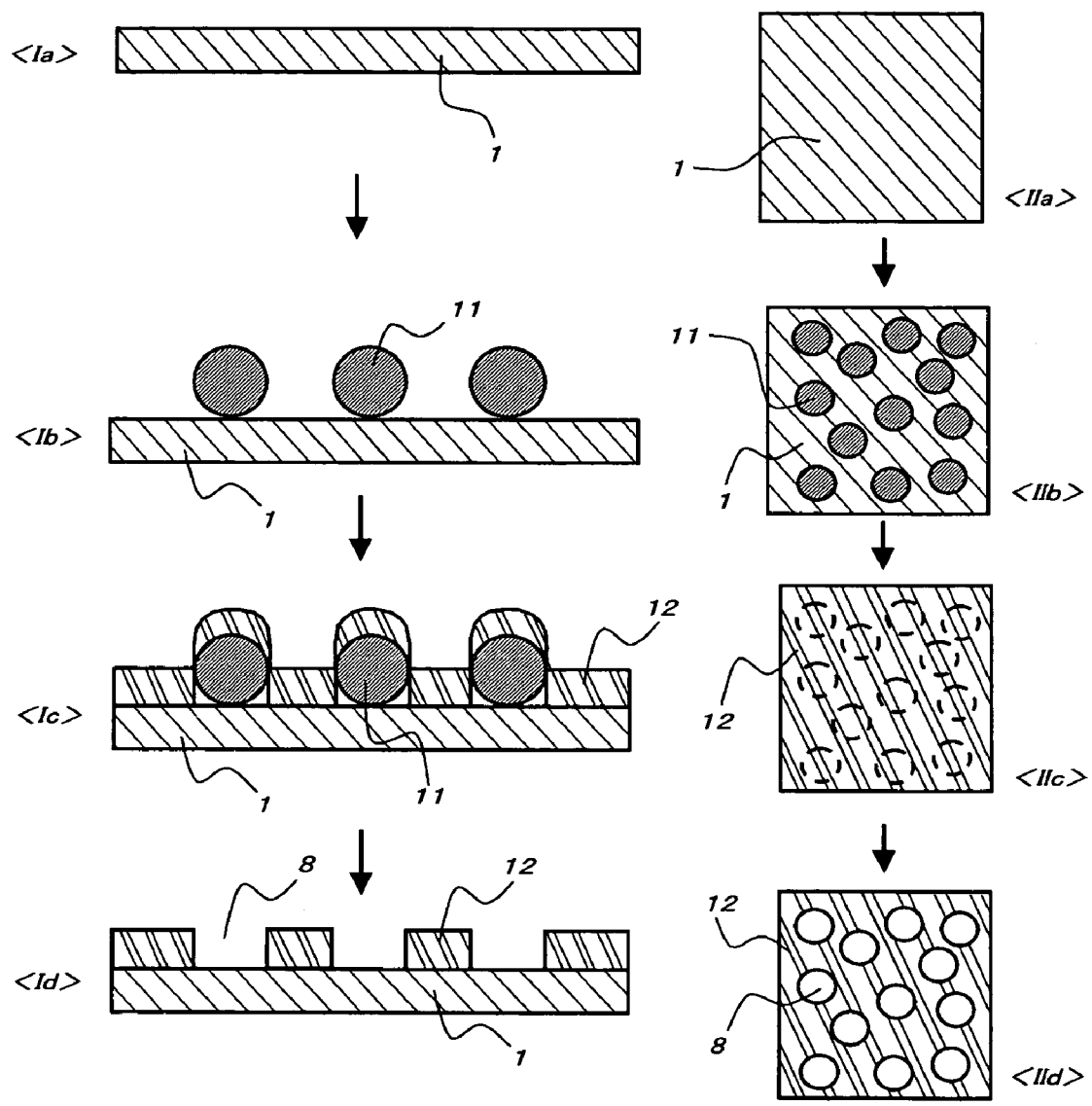
FIG. 1 is a schematic view showing an example of steps for a method of producing a porous thin-film-deposition substrate of the present invention.

According to the present invention, there is provided the following means:

(1) A method of producing a porous thin-film-deposition substrate, comprising:

placing, onto a substrate that has an electrostatic charge on its surface, fine particles with a surface electrostatic charge opposite to the electrostatic charge of the substrate surface, depositing a thin film, including at least one layer, on the fine-particle-placed substrate, and then removing the fine particles to form fine pores in the film on the substrate.

(2) The method of producing a porous thin-film-deposition substrate according to item (1), comprising heating to soften the fine particles for adhering and fixing the particles on the substrate.

(3) The method of producing a porous thin-film-deposition substrate according to item (1), wherein the fine particles are polymer fine particles.

(4) The method of producing a porous thin-film-deposition substrate according to item (1), wherein an average opening diameter of the pores of the thin film is 1 nm to 10 µm.

(5) The method of producing a porous thin-film-deposition substrate according to item (1), wherein the surface of the substrate is modified by a surface modifier.

(6) A porous thin-film-deposition substrate produced in accordance with the method of item (1).

(7) A switching element, comprising: the porous thin-film-deposition substrate of item (6), and another thin film formed on the porous thin-film-deposition substrate.

(8) The switching element according to item (7), wherein at least one layer of the thin films is a layer of an organic charge-transferable material.

(9) The method of producing a porous thin-film-deposition substrate according to item (1), comprising: sticking an adhesive sheet on the fine-particle-placed substrate with the film deposited thereon, and peeling the adhesive sheet for removing the fine particles to leave the fine pores in the film layer.

(10) The method of producing a porous thin-film-deposition substrate according to item (9), wherein an adhesive plane of the adhesive sheet is smooth.

(11) The method of producing a porous thin-film-deposition substrate according to item (9), wherein the adhesive sheet is flexible.

(12) The method of producing a porous thin-film-deposition substrate according to item (9), wherein an adhesive strength of the adhesive sheet is 0.1 N/cm to 5 N/cm.

(13) The method of producing a porous thin-film-deposition substrate according to item (9), wherein the thin film contains at least one organic semiconductor layer.

(14) A method of producing an electron emitting element, comprising:
  adding a catalyst metal on a substrate,
  placing fine particles onto the catalyst-added substrate,
  depositing a thin film, including at least one layer, on the fine-particle-placed substrate, then
  removing the fine particles to form fine pores in the film, and
  growing needle-shaped conductors as an aggregate thereof on the catalyst metal that is exposed on a bottom face of the fine pore.

(15) The method of producing an electron emitting element according to item (14), wherein an average opening diameter of the fine pores is 1 nm to 10 µm.

(16) The method of producing an electron emitting element according to item (14), wherein the coefficient of variation of the opening ratio of the fine pores is 50% or less.

(17) The method of producing an electron emitting element according to item (14), wherein at least one electrode layer is formed under the catalyst metal.

(18) The method of producing an electron emitting element according to item (14), wherein an insulation layer and an electrode layer are included in the thin film.

(19) The method of producing an electron emitting element according to item (14), wherein a dipping adsorption method is used to provide the fine particles onto the substrate.

(20) The method of producing an electron emitting element according to item (14), wherein the needle-shaped conductor is a whisker obtained by growing carbon nanotubes.

(21) A display element, comprising the electron emitting element produced in accordance with the method of item (14).

(22) An electron emitting element, comprising:
  a substrate with at least one layer of a base film formed thereon,
  another thin film layer, formed on the base film, having fine pores arranged substantially at an equal interval, and
  an aggregate of needle-shaped conductors formed on each bottom face of the fine pores;
  wherein the fine pores of the film layer are formed by removing fine particles from the substrate, in that the fine particles are once placed onto the surface of the base film on the substrate in accordance with a dipping adsorption method, and then the film layer is deposited on the fine-particle-placed substrate.

(23) The electron emitting element according to item (22), wherein the base film includes:
  an electrode layer sharing its surface to be the bottom face of the fine pores, or
  an electrode layer under a layer sharing its surface to be said bottom face; and
  an insulation layer positioned under the electrode layer.

(24) The electron emitting element according to item (22), comprising: a catalyst metal to be exposed at the bottom face of the fine pores after the fine particles are removed, and needle-shaped conductors grown on the catalyst metal.

(25) The electron emitting element according to item (22), wherein an average opening diameter of the fine pores is 1 nm to 10 µm.

(26) The electron emitting element according to item (22), wherein the needle-shaped conductor is made of a carbon nanotube.

(27) A display element comprising the electron emitting element according to item (22).

The present invention will be explained hereinafter in detail.

FIG. 1 is a schematic view showing an example of steps for producing a porous thin-film-deposition substrate in the present invention. In FIG. 1, each step is shown by a partial sectional view (step Ia to step Id) and each corresponding step is shown by a partial plane view (step IIa to step IId).

First, a substrate 1 having electrostatic charges on the surface thereof is prepared (step Ia, step IIa). Next, fine particles 11 having electrostatic charges having polarity opposite to that of the charges on the surface of the substrate are placed (step Ib, step IIb). In the present invention, the term "placed" includes meaning of "established" or "adsorbed". A thin film (vapor deposition film, laminate film) 12 is deposited on the fine-particle-placed substrate (step Ic, step IIc). Then, the placed fine particles 11 and the thin film mounting on the particles 11 are removed, to form a porous thin-film-deposition substrate including the thin film 12 provided with a through-hole 8 on the substrate (step Id, step IId).

Figure 2:
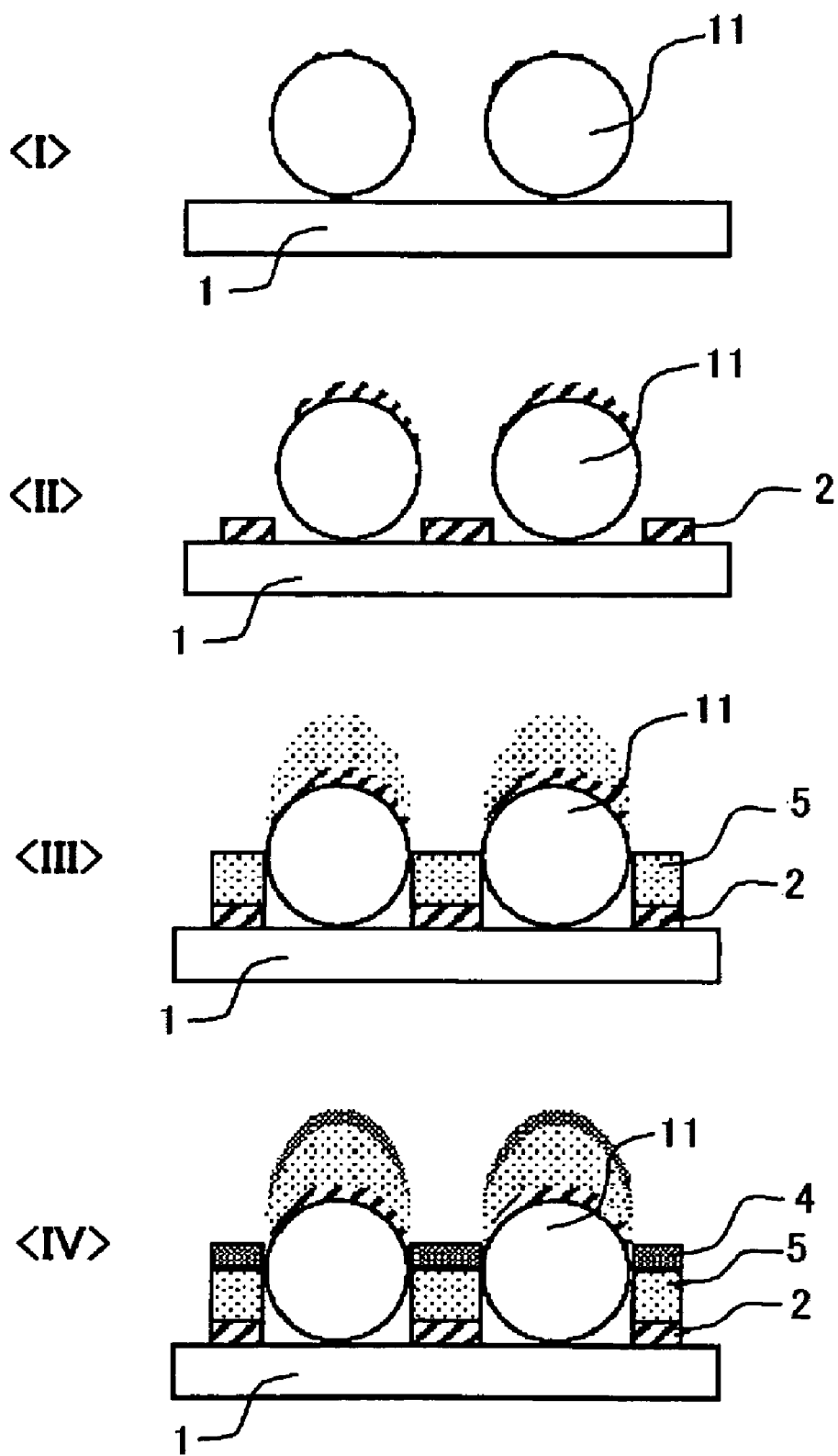
FIG. 2 is a section view schematically showing an example of steps for a method of producing a porous thin-film-deposition substrate of the present invention.

As shown in FIG. 2, the thin film may be formed as a laminate film. For example, after the fine particles 11 are placed on the substrate 1 (step I), multiple layers of a thin film meeting desired functions, for example, each layer including a drain electrode 2, an organic charge transferable layer 5 and a gate electrode 4 is deposited (steps II to IV) and then the fine particles 11 and the thin film on the particles are removed to make a porous thin-film-deposition substrate having a laminate structure.

(Placing Fine Particles)

As conventional methods of placing fine particles on the substrate, a bar coating method, squeegee method, spin coating method, ink jet method, spray method or the like is currently used. It is assumed that among these methods, a spin coating method makes it possible to carry out treatment uniformly in a relatively small area and a spraying method makes it possible to carry out treatment uniformly in a large area (see the publication of JP-A-2005-79352). However, in order to realize good characteristics as the switching element, the required characteristics cannot be satisfied by these methods. It is therefore necessary to establish a method of placing fine particles for forming a more uniform and fine porous thin-film-deposition substrate.

In view of this situation, the inventors have found the present invention. In a method of the present invention, fine particles are placed on a substrate by a novel process (i.e. a dipping adsorption process) without depending on the conventional methods. In this method, e.g., a substrate can be dipped in a dispersion liquid in which fine particles are dispersed to allow the fine particles to adsorb onto the substrate by the electrostatic interaction between the substrate and the particles. In establishing the fine particles, it is preferable to sufficiently raise the interaction between the substrate and the particles. When the substrate itself has sufficient electrostatic charges, the fine particles can be established directly on the substrate.

Figure 3:
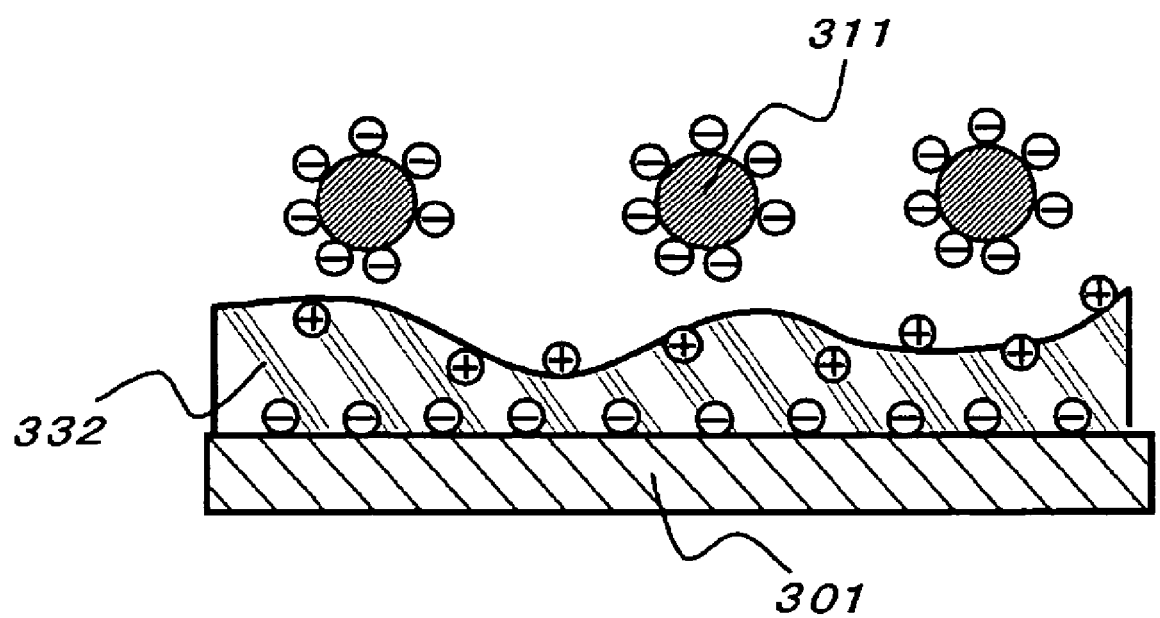
FIG. 3 is a schematic view for explaining a dipping adsorption method using a surface modified substrate.

On the other hand, when the substrate itself has no electrostatic charge or even if the substrate has electrostatic charges, these charges are weak, a surface modifier may be used. The electrostatic charge can thereby be increased by modifying the surface of the substrate. Also, as shown in FIG. 3, when a substrate 301 and fine particles 311 have electrostatic charges having the same polarities as each other (in FIG. 3, the case where the both have negative charges is exemplified), a surface modifier 332 is preferably used to allow the surface of the substrate to have a positive polarity. Thereby, the fine particles can be established. It is possible to form laminated surface modified layers, if necessary, by using plural surface modifiers.

(Treatment After Placing Fine Particles)

The fine-particle-placed substrate pulled up from the dispersion liquid contains a residual dispersion medium and is therefore preferably dried by natural drying at ambient temperature, air-blowing drying using compressed air, drying under reduced pressure or by raising the temperature.

In the meantime, the placed fine particles tend to coagulate when the substrate is pulled up from a dispersion medium and dried. It is necessary to provide a means that prevents this. If the fine particles coagulate, the uniform dispersibility of the fine particles is lost, causing a reduction in the performance when the substrate is used in an element. As to the reason of the coagulation like this, fine-meniscuses are formed between the fine particles when the dispersion medium left unremoved on the substrate is dried, and capillary force is produced between the particles to cause coagulation. It is preferable to strengthen the electrostatic interaction between the aforementioned substrate and particles to thereby improve the adhesion of the fine particles to the substrate to control the coagulation.

In order to improve fixing tendency, it is preferable to soften the fine particles moderately by heating to thereby increase the area where the fine particles are disposed on the substrate. Any method may be used as the heating method insofar as it does not deteriorate the substrate and can soften the disposed fine particles properly. For example, a method in which the substrate is rinsed in a liquid, a method in which the substrate is dipped in a heated fine particle dispersion liquid and a method in which the substrate is directly heated by using a hot plate or the like are preferable. In the case of the heating by in-liquid rinsing, an aqueous type solvent (for example, distilled water, ultra-pure water or ion exchange water), an organic solvent (for example, alcohols or acetone) or mixtures of these solvents are preferably used. An aqueous type solvent is more preferable from the viewpoint of handling characteristics and industrial applications. The heating time in the in-liquid rinsing may be optionally determined. It is preferably 1 second to 10 minutes and more preferably 10 seconds to 1 minute.

The heating temperature is preferably a temperature at which the fine particles are properly softened so that they are fixed to the substrate and may be optionally set according to the fine particles to be used. When, for example, polymer fine particles are used, they are preferably softened under heating at a temperature around the glass transition temperature (Tg) of the polymer, preferably at a temperature of Tg plus 30° C. or less and a temperature of Tg minus 30° C. or more (i.e., a temperature between Tg+30° C. and Tg−30° C.), and more preferably at a temperature of Tg plus 10° C. or less and a temperature of Tg minus 10° C. or more (i.e., a temperature between Tg+10° C. and Tg−10° C.). Further, the treatment temperature is preferably one that is capable of softening the surface of the fine particles or more, and below a temperature at which bubbles are formed on the surface of the substrate. The heating temperature is preferably 70° C. to 100° C. and more preferably 80° C. to 100° C. in consideration of the heating by in-liquid rinsing in an aqueous solvent and the production of an organic semiconductor.

After heated, the substrate is preferably cooled to prevent coagulation without fail. For example, the substrate is preferably rinsed with cooling water (for example, water at a room temperature or less).

Also, it is preferable, after the fine particles are adsorbed, that excess particles on the substrate are washed. The reason is that when this treatment is not carried out, the fine particles may not form a mono-particle layer, but a region where the particles are accumulated may be formed.

The steps for carrying out drying, heating, cooling, or washing may be optionally determined taking working efficiency into account. It is preferable that after the fine particles are disposed and these steps are completed, the process be shifted to the formation of a thin film. When the heating or cooling treatment is carried out by in-liquid rinsing, the treatment doubles as washing treatment.

(Substrate)

Though no particular limitation is imposed on the material of the substrate, the material preferably has electrostatic charges on its surface. As the material, glass, metal oxides (for example, aluminum oxide, silica ($SiO_2$), ITO), or plastic films coated with these metal oxides (for example, a polyethylene terephthalate (PET) film, polyethylene naphthalate (PEN) film, polycarbonate film) are preferable. In the metal oxides, those having high reactivity such as aluminum tend to form an oxide film on the surface thereof and each of these materials may be therefore used as it is. However, in the case of, for example, gold and platinum, such treatment as to form a monomolecular layer on its surface by using a compound containing a thiol group (for example, 11-amino-1-undecanethiol, 10-carboxy-1-decanethiol, 11-hydroxy-1-undecanethiol) is preferably carried out.

Moreover, hydrophilic or hydrophobic properties, electrostatic charges, irregularities and the like may have an influence on the adhesion of the fine particles and are therefore preferably controlled. With regard to treatment of the surface of the substrate, it is preferable to carry out pretreatment conforming to the aforementioned dipping adsorption method in consideration of these natures. Preferable examples of the treatment include surface treatments using ultraviolet rays (UV)/ozone washing and surface modifications using surface modifiers (for example, poly (diallyldimethylammonium chloride) (PDDA), poly(sodium styrenesulfonate), poly(3,4-oxyethyleneoxythiophene)). Though no particular limitation is imposed on the thickness of the substrate, the thickness is preferably 0.1 mm to 10 mm in the case of a glass substrate, and 1 µm to 1 mm in the case of a film substrate.

Also, the substrate used in the production of a porous thin-film-deposition substrate of the present invention may be formed with a thin film layer before the fine particles are placed, insofar as placing the fine particles is not hindered. Thus, in the present invention, the term "substrate" means a substrate itself and a substrate with a predetermined layer or film formed thereon. As a thin film, an electrode layer, charge transferable material layer, or the like may be adopted according to the layer structure of an element.

(Dispersion Liquid)

The dispersion liquid is preferably a liquid that does not hinder the electrostatic interaction between the fine particles and the substrate and can disperse the fine particles stably during the process. The dispersion liquid may be either water or an organic solvent, and it is preferably water from the viewpoint of preparing the dispersion liquid easily and intensifying the electrostatic interaction. A surfactant may appropriately be added to improve the dispersibility of the fine particles. The dispersion concentration of the fine particles may be appropriately controlled according to the natures of the fine particles or substrate and the density of the fine particles to be provided. It is preferably 0.01% by weight to 10% by weight and more preferably 0.1% by weight to 1% by weight.

(Fine Particles)

No particular limitation is imposed on the material of the fine particles, and it is preferable that the material have electrostatic charges on its surface or allow electrostatic charges to be imparted thereto. Also, as the material, those that are softened by the above heating treatment are preferably used. In the case of, for example, polymer fine particles, the particles have a glass transition temperature of, preferably −100° C. to 200° C. and more preferably 0° C. to 120° C. Examples of such fine particles include polystyrene fine particles, polymethylmethacrylate fine particles and benzylpolymethacrylate fine particles. Among these fine particles, polystyrene fine particles are more preferable, because the particle diameter is monodispersion, the degree of freedom of the surface functional group is high and they are easily available.

The electrostatic interaction between the fine particles and the substrate may also be controlled by the shape of the fine particles and the surface treating method. Therefore, the fine particles are made have an appropriate shape and may be surface-treated. At this time, the fine particles are preferably made to have a shape and surface-treated in a manner as to be fit for removing the fine particles, after the thin film is formed. The shape of the fine particles is preferably a spherical form, spheroidal form or polyhedral form and more preferably a spherical form. As to the surface modification of the fine particles, core-shell formation, chemical modification, plasma treatment, addition of surfactants and addition of a substituent (for example, a carboxyl group, trialkylammonium group, amino group, hydroxyl group, sulfonic acid group) are preferable.

Moreover, the size (opening diameter) of the fine pore formed in the thin film can be controlled by the size (particle diameter) of the fine particle. It is therefore preferable to select particles fit for designing a desired switching element. The average particle diameter (the particle diameter in the present invention means the diameter of a circle equivalent to the projected area of the particle) is preferably 1 nm to 10 µm, more preferably 10 nm to 10 µm and particularly preferably 30 nm to 1 µm. Although no particular limitation is imposed on the distribution of particle diameters of the fine particles, the distribution of particle diameters is preferably monodispersion and the coefficient of variation (here, the coefficient of variation is a percentage of the standard deviations of individual particle diameters to an average of the particle diameter and also called a CV value) is preferably 50% or less, more preferably 20% or less and particularly preferably 10% or less.

(Thin Film)

A thin film adopted in a method of producing a porous thin-film-deposition substrate in the present invention may be formed by various thin film forming methods such as a sputtering method, vapor deposition method, plating method, thin film patterning method such as coating method and spraying method. An appropriate method may be selected from these methods corresponding to the type of material to be used. The thickness of the thin film may be designed every material from the viewpoint of designing for an element operation and selective ratio and sensitivity for mechanical selective peeling and is preferably 1 nm to 10 µm. The thickness of the thin film in which fine pores are formed is preferably the same or less than the particle diameter and more preferably less than ½ the particle diameter from the viewpoint of removing the placed fine particles. When the thin film is formed as a laminate film, there is no particular limitation to the number of laminated layers. Each layer in a laminate film may be made to be each functional layer when it is used in an element, and may be, for example, a source electrode layer, drain electrode layer, gate electrode layer, charge transferable material layer, electrodes (for example, a cathode electrode and gate electrode), catalyst metal layer, dielectric (insulation) layer, and protective film (for example, metals, metal oxides and polymers).

(Removal of Fine Particles)

In a method of the present invention, for removing fine particles, it is preferable to employ a method in which the formed thin layer is not damaged and the fine particles can completely be removed. For example, it includes ultrasonic wave treatment in a liquid phase. In the case of removing the fine particles in the ultrasonic wave treatment in a liquid phase, it is preferable to select a solvent which can disperse the fine particles and can undamage the thin film. For example, in the case that the formed film is made of a material hard to be solved in an organic solvent and the fine particles are hydrophilic, a hydrophilic organic solvent can be used. To improve peeling ability and selectivity, a temperature of a washing liquid, or intensity or frequency of ultrasonic wave can be selected if necessary. Frequency of ultrasonic wave is preferably 100 Hz to 100 MHz, more preferably 1 kHz to 10 MHz. It is also preferable that plural ultrasonic waves in a wide range are simultaneously irradiated, or that ultrasonic waves are irradiated by switching them by turns.

In the above method, however, the fine particles disposed in the center of the substrate are hardly removed. Also, when the film thickness of the thin film is increased, the removal of the fine particles is more difficult. Therefore, this method is effective only when the film thickness of the thin film is sufficiently low. Also, when the fine particles are removed by long time ultrasonic radiation in the case where the film thickness is large, there is the case where the deposited thin film is broken and this is undesirable. Furthermore, the removal is carried out in a liquid. Therefore, there is the case where a solvent to be used affects the thin film though this depends on the solvent and the nature of the thin film material. In view of this situation, it is preferable to remove the fine particles by using an adhesive sheet as a method that can solve these problems.

Figure 4:
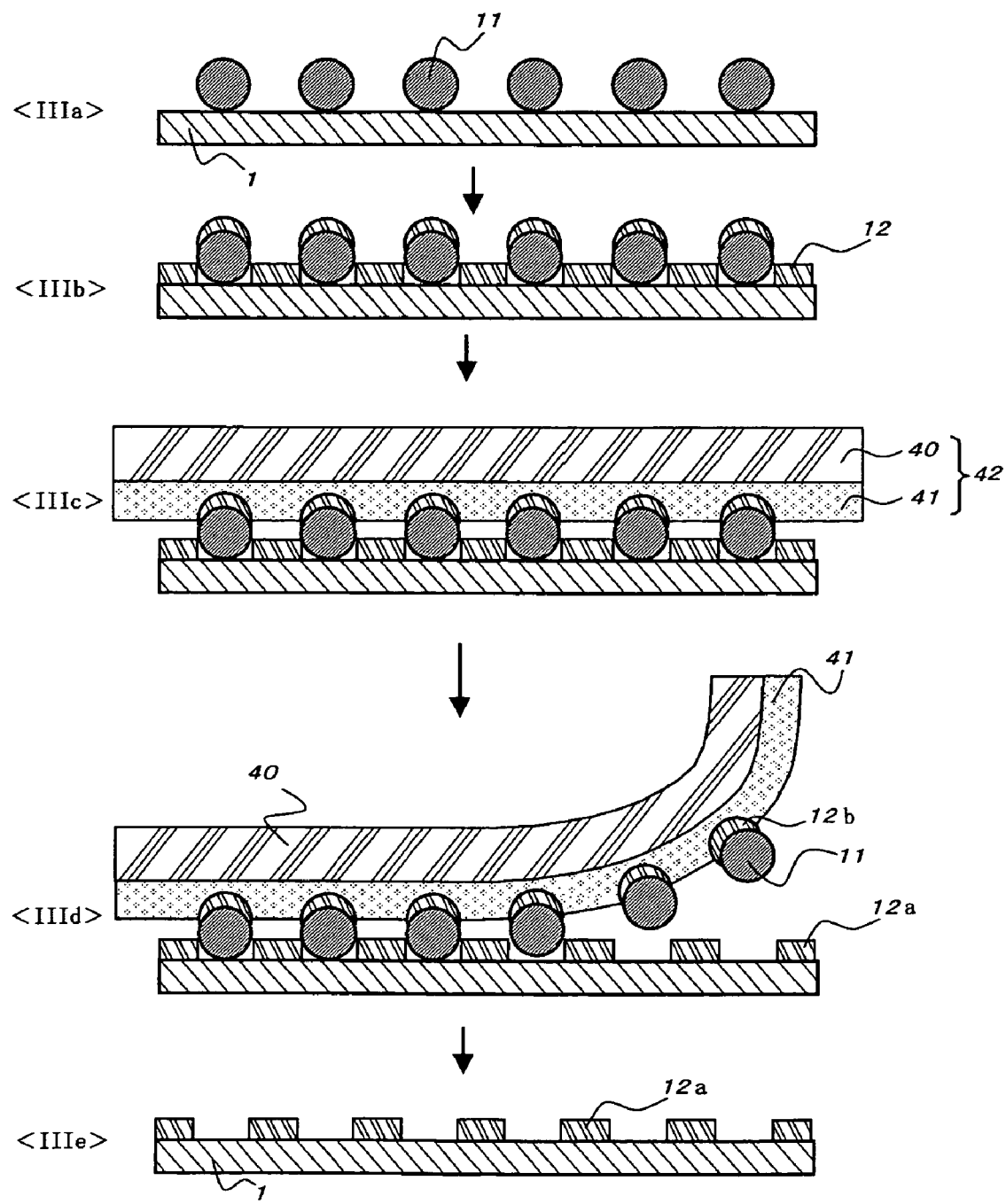
FIG. 4 is a section view schematically showing steps for removing fine particles by an adhesive sheet, wherein IIIa shows a step of disposing fine particles on a substrate, IIIb shows a step of depositing a thin film on a substrate on which the fine particles are placed, IIIc shows a step of applying an adhesive sheet to a substrate on which the thin film is deposited, IIId shows a step of peeling the adhesive sheet, and IIIe shows a thin-film-deposition substrate having fine pores.

FIG. 4 is a section view schematically showing the process (steps IIIa to IIIe) of removing the fine particles from the substrate by an adhesive tape. The fine particles 11 are disposed on the substrate 1 (step IIIa), the thin film 12 is deposited on the fine particles (step IIIb). As these methods, the methods explained in FIGS. 1 and 2 may be preferably used. Next, an adhesive sheet 42 consisting of an adhesive layer 41 and a support 40 is applied in a manner as to be in contact with the fine particles 11 and/or the thin film thereon (step IIIc). Then, when this adhesive sheet is peeled off (step IIId), the fine particles 11 together with the thin film 12b located on the fine particles are stuck to the adhesive layer 41 and removed. According to a method of the present invention, the fine particles 11 are placed densely on the substrate, and therefore the adhesive sheet 42 is stuck to the upper part of the fine particles, so that the adhesive layer 41 is not stuck to the thin film 12a around the fine particles on the substrate, which makes it possible to leave the thin film 12a on the substrate. In this manner, only the fine particles 11 and the thin film 12b located on the fine particles are removed without damaging or breaking the thin film 12a, whereby a uniformly shaped porous thin-film-deposition substrate can be formed (step IIIe).

The adhesive sheet used to remove the fine particles may be optionally selected according to, for example, the shape of the fine particles, the particle diameter of the fine particles, the material of the thin film and the thickness of the thin film (relation with the particle diameter) without any particular limitation. Commercially available products that meet these requirements may be used. To secure selective and uniform adhesion of the fine particles, the adhesive plane is preferably smooth. As to the smoothness of the adhesive plane, it is preferable that no irregularity be visually observed. Also, when the base material has been subjected to emboss processing or the base material itself has irregularities like crepe paper, since the adhesive plane reflects the irregularities of the base material, the base material is preferably one having no such irregularities as observed visually. It is preferable, when the base material has a smooth surface, that an adhesive layer does not directly contact with a substrate surface, but contacts only with particles or volume membranes having particle shape. Also, the base material preferably has moderate adhesive strength to the thin film material on the surface of the particle and has an adhesive strength of, preferably 0.1 N/cm to 5 N/cm and more preferably 0.3 N/cm to 3 N/cm in terms of the value showing adhesive strength according to JIS Z-0237. In addition, the sheet including the support preferably has appropriate flexibility and has, for example, an extension of preferably 50% to 600% and more preferably 100% to 500% (In the present invention, unless otherwise particularly specified, an extension is defined and measured according to JIS-C2318.).

Examples of the material constituting the support include, though not particularly limited to, a polyvinyl chloride film, polyester type film, crepe paper, polyolefin type white film, acetate film and copolymers or blend polymers of these materials. Any material may be used as the material used for the adhesive insofar as it has proper adhesive strength and does not contaminate the thin film and examples of the adhesive material include rubber type adhesives, acryl type adhesives and urethane type adhesives. The thickness of the adhesive sheet may be selected in accordance with flexibility (for example, extension) and strength (for example, tensile strength). The thickness of the adhesive sheet is preferably 10 μm to 1 mm and more preferably 50 μm to 300 μm, though no particular limitation is imposed on it.

In consideration of application to electronic devices, it is not preferable to contaminate the surface of the substrate with harmful substances such as ionic compounds and the fine particles when the adhesive sheet is applied and peeled off. Preferable examples of the adhesive sheet include a protective film used, for example, at the time of back-grinding of a silicone semiconductor (see, the publication of JP-A-2004-91563).

When the adhesive tape is applied, it is preferable to evade the involvement of air cells. Also, as the peeling method, a method that removes the fine particles without fail and does not damage the thin-film-deposition substrate is preferable. For example, the adhesive sheet may be peeled off at a moderate speed by confirming visually. Furthermore, it is preferable to control the application pressure, rate of application or peeling and the angle of the substrate with the sheet when the adhesive sheet is peeled off (for example, the tape is turned up in a direction of 180° or bent in a direction at right angle to peel off the tape). It is also preferable to properly select a coating instrument (for example, a rubber roller is given as an example and the roller is preferably a roller that has a smooth surface and has an appropriate weight of about 0.1 kg to 5 kg).

Also, as the adhesive tape, those obtained by winding the substrate plane of the adhesive sheet around a roller and roller-like materials whose surfaces have adhesion may be used.

(Fine Structure)

Figure 5:
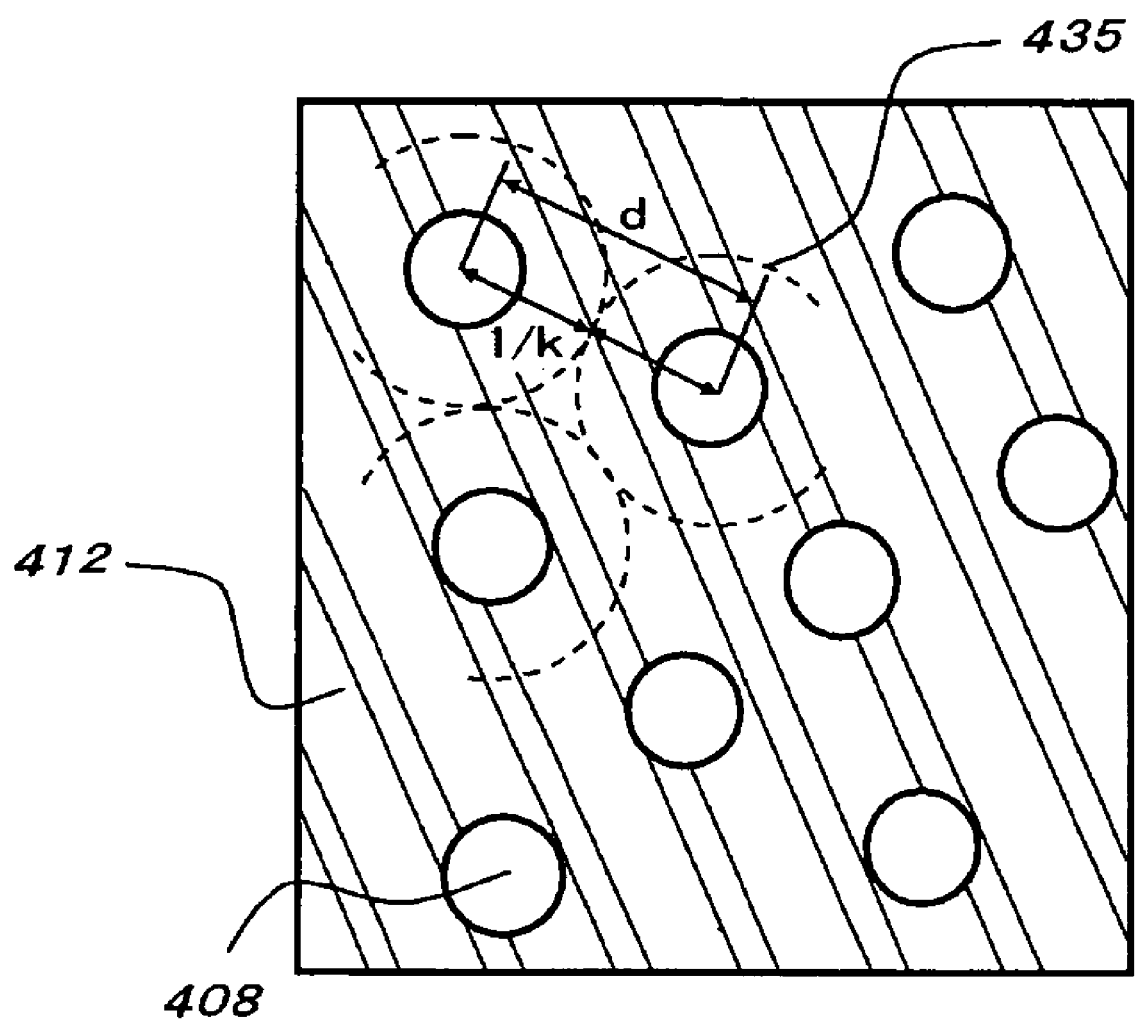
FIG. 5 is a plane view for schematically explaining the relationship of the distance between holes in a porous thin-film-deposition substrate.

The opening diameter (hereinafter referred to as "pore diameter") of fine pores of the porous thin-film-deposition substrate obtained in a method of the present invention is almost equal to the particle diameter of the fine particles used in the course of the formation of these pores. The pore diameter of the thin film and the distribution of pore diameter can be freely controlled by changing the particle diameter of the fine particle and the distribution of particle diameter by utilizing this nature. Though the pores are basically positioned at random, the relative positional relation between pores has a definite regularity. This is because the positions of pores are the same as the positions where the fine particles are disposed and the distance between the pores is defined by the distance between the particles. When explanations are made with reference to FIG. 5, the distance (distance between pores) d between the centers of fine pores 408 formed on the thin film 412 is the same as the center distance of the disposed fine particles and is twice the Debye length (1/k) so-called in the DLVO theory as to a colloid dispersion system. This region is indicated by the dotted line as a region 435 of the Debye length. The Debye length can be controlled by changing the pH of a dispersion liquid used for dipping and adsorption and the concentration of a salt to be added, whereby the distance between pores can be controlled. A structure of uniform and highly dispersed fine pores can be formed by the above action.

(Switching Element)

The porous thin-film-deposition substrate obtained by a method according to the present invention has uniform and highly dispersible fine pores that cannot be attained by the conventional methods. The porous thin-film-deposition substrate thus has high industrial value and is expected to be applied in wide fields. For example, it may be preferably used as various switching element and more preferably used as switching element utilizing a static induction type transistor (SIT) or a field effect type transistor (FET). Also, because heating at high temperatures is not required in the course of producing the porous thin-film-deposition substrate, the substrate is preferably used as a switching element containing an organic semiconductor in the active layer.

<SIT Type Switching Element>

When the porous thin-film-deposition substrate obtained by a method of the present invention is used as a SIT type switching element using an organic semiconductor as the active layer, this SIT type switching element allows larger distances between the gate electrode and the source electrode, and between the gate electrode and the drain electrode. Therefore, the parasitic capacitance between the gate electrode and the source electrode, and between the gate electrode and the drain electrode, can be decreased to improve the operational speed.

Furthermore, a part of the source electrodes that inject carriers may be formed projecting toward the gate electrode at the position of a through-hole of the gate electrode, to thereby improve carrier injection efficiency due to electrostatic focusing. The above effect is significant when the height of the through-hole is almost the same as or less than the thickness of the organic semiconductor layer. Though it is unnecessary that the pore of the drain electrode of the switching element is penetrated through the layer, it is preferably penetrated through the layer.

In the SIT switching element using an organic semiconductor as the active layer, if the gate electrode is coated with an electron transferable organic charge transferable material layer, the switching element works as a normally-off type, making it possible to carry out wide tuning of elemental properties.

<FET Type Switching Element>

When a porous thin-film-deposition substrate obtained by a method of the present invention is used for a FET type switching element using an organic semiconductor as the active layer, plural extremely small through-holes are formed in the drain electrode, and a part of the source electrodes that inject carriers may be formed projecting toward the drain electrode at the position of through-holes. Therefore, an insulation gate FET type switching element characterized by high input resistance has a remarkably shorter channel length than the conventional type thin film FET type switching element, making it possible to operate at a high rate. Furthermore, because in addition to the amount of carriers in the channel part, carrier injection efficiency from the projected source electrode can be modulated, interactive conductance can be improved.

[1] Organic Switching Element

Embodiments of a static induction type transistor (SIT) and a field effect type transistor (FET) utilizing the porous thin-film-deposition substrate obtained by a method of the present invention will be explained in more detail. However, these embodiments do not limit the present invention.

(A) Static Induction Type Transistor (SIT)

<1>SIT (1)

Figures 1, 6:
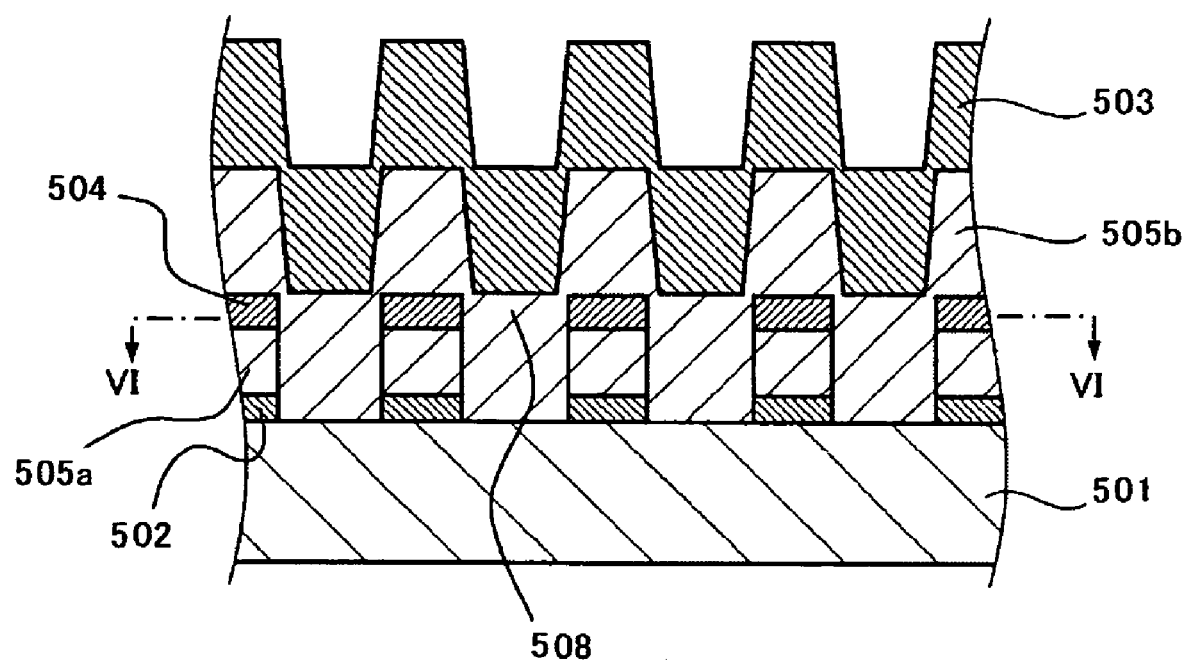
Figures 2, 6:
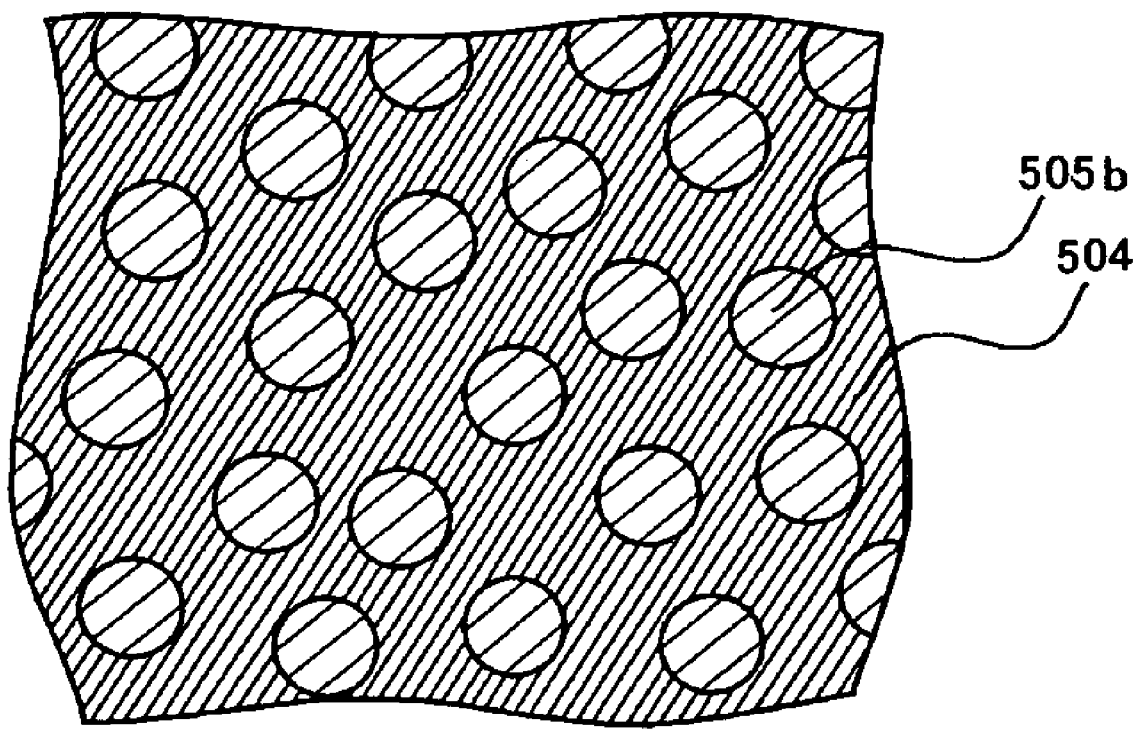

FIG. 6-1 shows a typical element structure of SIT (1) that is an example of an organic switching element of the present invention. SIT(1) is provided with a substrate 501, and with an electrode pair consisting of a source electrode 503 and a drain electrode 502 and a porous sheet-like gate electrode 504 is formed between these electrodes in such a manner that the gate electrode 504 is not in contact with these electrode pair. The drain electrodes 502 and the gate electrodes 504 have through-holes at substantially the same positions on the electrode plane. These through-holes form common through-holes. The term "substantially the same position" means a position where the through-holes or pores are seen to be overlapped on the same axis when the switching element is seen through vertically from the source electrode side or the substrate side. The source electrode 503 has a projecting structure in which it is projected towards the gate electrode 504 at the position of the through-hole. Organic charge transferable material layers 505a and 505b are filled between the electrodes and in the through-holes 508 disposed between the gate electrode 504 and the drain electrode 502. The gate electrode 504 is connected with the organic charge transferable material layers 505a and 505b by Schottky junction.

(a) Organic Charge Transferable Material Layer

The organic charge transferable material layers 505a and 505b may be constituted of an organic hole transferable material or electron transferable material, and is preferably constituted of an organic semiconductor doped with a p-type or n-type dopant. The organic semiconductor may be either a low-molecular compound or a high-molecular compound.

Preferable examples of the low-molecular compound include phthalocyanine derivatives, naphthalocyanine derivatives, azo compound derivatives, perylene derivatives, indigo derivatives, quinacridone derivatives, polycyclic quinone derivatives such as anthraquinones, cyanine derivatives, Fullerenes derivatives, nitrogen-containing cyclic compound derivatives such as indole, carbazole, oxazole, isooxazole, thiazole, imidazole, pyrazole, oxadiazole, pyrazoline, thiadiazole and triazole, hydrazine derivatives, triphenylamine derivatives, triphenylmethane derivatives, stilbenes, quinone derivatives such as anthraquinonediphenoquinone and polycyclic aromatic compound derivatives such as anthracene, pentacene, pyrene, phenanthrene, coronene and rubrene.

The high-molecular compound is preferably compounds in which the above low-molecular compound is incorporated into a primary chain of a usual and electrically inert high-molecular chain such as a polyethylene chain, polysiloxane chain, polyether chain, polyester chain, polyamide chain or polyimide chain, or compounds in which the above low-molecular compounds are bound with these chains pendant-wise as a side chain.

As the high-molecular compound, conjugate high-molecular compounds are preferably used. Given as preferable examples of the conjugate high-molecular compound are carbon-type conjugate high-molecular compounds including aromatic conjugate high-molecular compounds such as polyparaphenylene, aliphatic conjugate high-molecular compounds such as polyacetylene, heterocyclic conjugate high-molecular compounds such as polypyrrole and polythiophene, hetero atom-containing conjugate high-molecular compounds such as polyanilines, polyphenylene sulfide, complex type conjugate type high-molecular compounds, such as poly(phenylenevinylene), poly(arylenevinylene) and poly(thienylenevinylene), which have structures in which the structural units of the above conjugate high-molecular compounds are combined alternately. Moreover, it is preferable to use high-molecular compounds in which polysilanes or oligosilanes having oligodisilanylene-carbon type conjugate structures, such as disilanyleneallylene polymers, (disilanylene)ethynylene polymers and (disilanylene)ethynylene polymers, and carbon type conjugate structures are alternately linked.

As the high-molecular compound, high-molecular compounds constituted of inorganic elements such as a carbon nanotube, phosphorous type and nitrogen type, high-molecular compounds in which an aromatic type ligand is coordinated with a high-molecular chain such as phthalocyanate polysiloxane, rudder-like high-molecular compounds obtained by ring-condensing perylenes such as perylenetetracaboxylic acid by heat treatment, rudder-type high-molecular compounds obtained by heat-treating polyethylene derivatives having a cyano group such as polyacrylonitrile and complex materials obtained by intercalating an organic compound into perovskites, besides the above compounds, may be used. The materials constituting the organic charge transferable material layers 505a and 505b may be the same or different and may be respectively one layer or a multilayer.

(b) Electrode

Any material may be used as the source electrode 503 and the drain electrode 502 without any particular limitation insofar as it has sufficient conductivity. As the material for the source electrode 503 and the drain electrode 502, metals such as gold, silver, copper, platinum, nickel, tungsten, aluminum, and alloys of these metals, metal oxides such as ITO, fluorine-doped stannic oxide and vanadium oxide, graphite, diamond doped with a n-type or p-type dopant, silicon, compound semiconductors and organic conductive materials containing conjugate high-molecular compounds such as polyanilines, polythiophenes and polypyrroles may be used.

No particular limitation is imposed on each thickness of the source electrode 503 and the drain electrode 502. The thicknesses of the source electrode 503 and the drain electrode 502 are respectively usually preferably 5 to 2000 nm, more preferably 10 to 500 nm, and particularly preferably 20 to 200 nm. In order to increase the amount of source-to-drain current, the source electrode 503 and the drain electrode 502 are usually preferably connected with the organic charge transferable material layers 505a and 505b by an ohmic contact. The gate electrode 504 and the drain electrode 502 may be formed into a sheet, which may have any shape including a plane form, curved form and cylindrical form.

There is no particular limitation to the thickness of the gate electrode 504. The thickness of the gate electrode 504 is usually preferably 5 to 500 nm, more preferably 10 to 100 nm, and particularly preferably 20 to 50 nm. If the thickness is too large, the interval between the source electrode 503 and the drain electrode 502 is widened, resulting in increased internal resistance. If the thickness is excessively small, this brings about a difficulty in the formation of a uniform and continuous film, an increase in the sheet resistance of the gate electrode 504, so that the voltage-current characteristic of the device is deteriorated, and also an OFF-current value is increased.

One side and other side of the gate electrode 504 are facing the source electrode 503 and the drain electrode 502 respectively, and plural through-holes 508 having one opening part on each side are formed. One side and other side of the drain electrode 502 are facing the gate electrode 504 and the substrate 501 respectively, and plural through-holes 508 having one opening part on each side are formed. The through-hole 508 of the drain electrode 502 exists on the same position as the through-hole 508 of the gate electrode 504.

The average radius of the opening parts of the drain electrode 502 and the gate electrode 504 is preferably the same as the sum of the thicknesses of two semiconductor layers 505a and 505b. The hole diameter of each opening part is preferably 1 nm to 10 µm, more preferably 10 nm to 500 nm and particularly preferably 20 nm to 400 nm. If the opening part is too large, the OFF-current value is increased, resulting in increased drive voltage. If the opening part is too small, the element is not turned on. Also, the opening ratio of the opening part (Total area of the opening parts×100/Total area where the through-holes are formed) is preferably 10 to 90% and more preferably 20 to 80%. When the opening ratio is too small, the internal resistance of the element is increased whereas when the opening ratio is too large, the sheet resistance of the gate electrode is increased.

FIG. 6-2 is a partial sectional view of the switching element shown in FIG. 6-1 along the line VI-VI. The gate electrode 504 has plural through-holes where the organic charge transferable material layer 505b is formed. The drain electrode 503 also preferably has the same plane shape as the gate electrode 504 shown in FIG. 6-2.

In SITs, in general, the opening parts are preferably disposed uniformly over the whole gate electrode, because the distribution of potential in the gate electrode plane tends to be uniformed, and for example a breakdown of an element due to electric field focusing is scarcely caused. Also, the value of current flowing between source/electrode corresponding to a variation in the gate voltage can be sharply changed. However; when the switching element is arrayed to use it as a switching element array for display, such uniform arrangement of the openings is not appropriately adopted. When a switching element is arrayed, in general, the characteristics among switching elements tend to vary. Therefore, if the source-to-drain current is changed too sharply at a specific gate voltage, source-to-drain currents of element are greatly different from each other even if the same voltage is applied, which makes it difficult to keep the uniformity of the display plane.

In order to prevent the above ununiformity, the response characteristic of the source-to-drain current to the gate voltage is rather preferably decreased to some extent. If there is an increased distribution of the hole diameters of the opening parts, the application of voltage in the gate electrode plane is made ununiform, leading to reduced response characteristic. However, if the application of voltage is made to be too irregular, the response characteristic is decreased less than a necessary level, and also an element is easily broken due to electric field focusing. The distribution of the hole diameters of the openings is thus preferably in a range from 0.1% to 20% in terms of CV value.

When the radius of the opening part is, particularly, e.g. about 0.5 to 1 µm, interference with visible light tend to be caused when the opening parts are distributed in a uniform pattern over the entire surface of the gate electrode. When an array of a switching element having such opening parts is used for a display, in case the gate electrode is seen through the display plane, interference fringes and Moire patterns tend to appear. That may cause a reduction in image quality in the case. The switching element of the present invention can prevent the generation of such interference fringes and Moire patterns because the arrangement of the opening parts of the gate electrode has moderate irregularity.

In case of the SIT(1) shown in FIG. 6-1, the gate electrode 504 is connected to the organic charge transferable material layers 505*a* and 505*b* by Schottky junction. When the organic charge transferable material layers 505*a* and 505*b* are p-type semiconductors, the material of the gate electrode 504 is preferably materials having a small work function. Preferable examples of these materials include aluminum and an aluminum alloy. When the organic charge transferable material layers 505*a* and 505*b* are n-type semiconductors, the material of the gate electrode 504 is preferably materials having a large work function. Preferable examples of these materials include gold, platinum, ITO, and tin oxide doped with fluorine.

<2>SIT(2)

Figure 7:
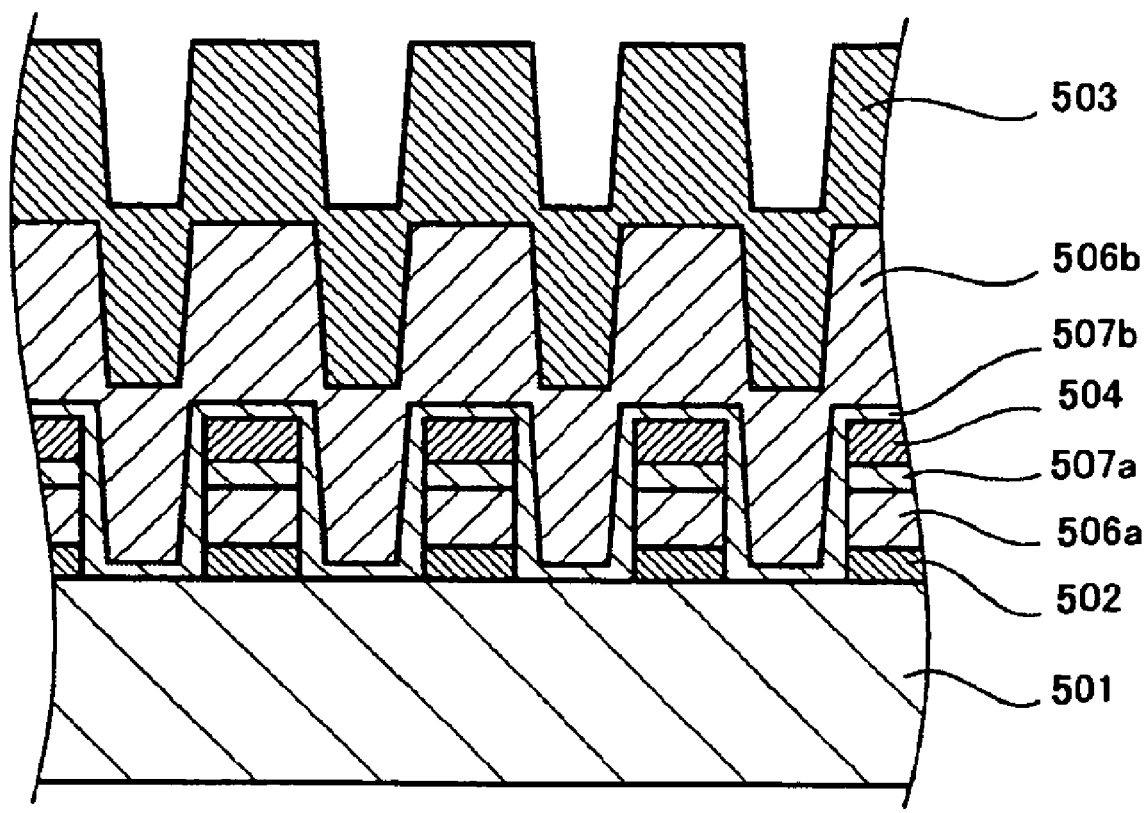
FIG. 7 is a partial sectional view schematically showing the structure of a SIT (2) as an example of a switching element of the present invention.

FIG. 7 shows a typical element structure of SIT(2), as another example of a switching element of the present invention. SIT(2) is provided with an electrode pair constituted of a source electrode 503 and a drain electrode 502 on a substrate 501. Between these electrodes, the porous sheet-like gate electrode 504 is formed in such a manner that it is not in contact with the electrode pair. A p-type organic charge transferable material layer (also referred to as a p-type hole transferable layer or a p-type semiconductor layer) 506*a* and a n-type organic charge transferable material layer (also referred to as a n-type electron transferable layer or a n-type semiconductor layer) 507*a* are filled and laminated one by one from the drain electrode 502 side between the drain electrode 502 and the gate electrode 504. An electron transferable organic charge transferable material layer (n-type semiconductor layer) 507*b* and a hole transferable organic charge transferable material layer (p-type semiconductor layer) 506*b* are filled and laminated, in the order of from the gate electrode side, between the source electrode 503 and a set of the drain electrode 502, the p-type semiconductor layer 506*a*, the n-type semiconductor layer 507*a*, and the gate electrode 504. Thus, the set of the drain electrode 502, the p-type semiconductor layer 506*a*, the n-type semiconductor layer 507*a*, and the gate electrode 504 are coated with the n-type semiconductor layer 507*b*, and therefore the set is not in contact with the p-type semiconductor layer 506*b*. Also, the drain electrode 502, the p-type semiconductor layer 506*a*, n-type semiconductor layer 507*a* and the gate electrode 504 are provided with through-holes at substantially the same position and namely, these through-holes form a common through-hole. The p-type semiconductor layer 506*b* and the source electrode 503 respectively have a projection structure in which it projects towards the drain electrode 502 at the position of the through-hole.

As the hole transferable organic charge transferable material layers 506*a* and 506*b* and the electron transferable organic charge transferable material layers 507*a* and 507*b*, the same materials that are used for the organic charge transferable material layers 505*a* and 505*b* of SIT(1) may be used. The structural materials for the hole transferable organic charge transferable material layers 506*a* and 506*b*, and those for the electron transferable organic charge transferable material layers 507*a* and 507*b*, may be the same or different. The material, shape and thickness of the source electrode 503 and drain electrode 507*b* may be the same as those in SIT(1). The shape and thickness of the gate electrode 504 and the structures of the through-hole formed from the gate electrode to the drain electrode and its opening may be the same as those in SIT(1).

<3>SIT(1') and SIT(2')

Figure 8:
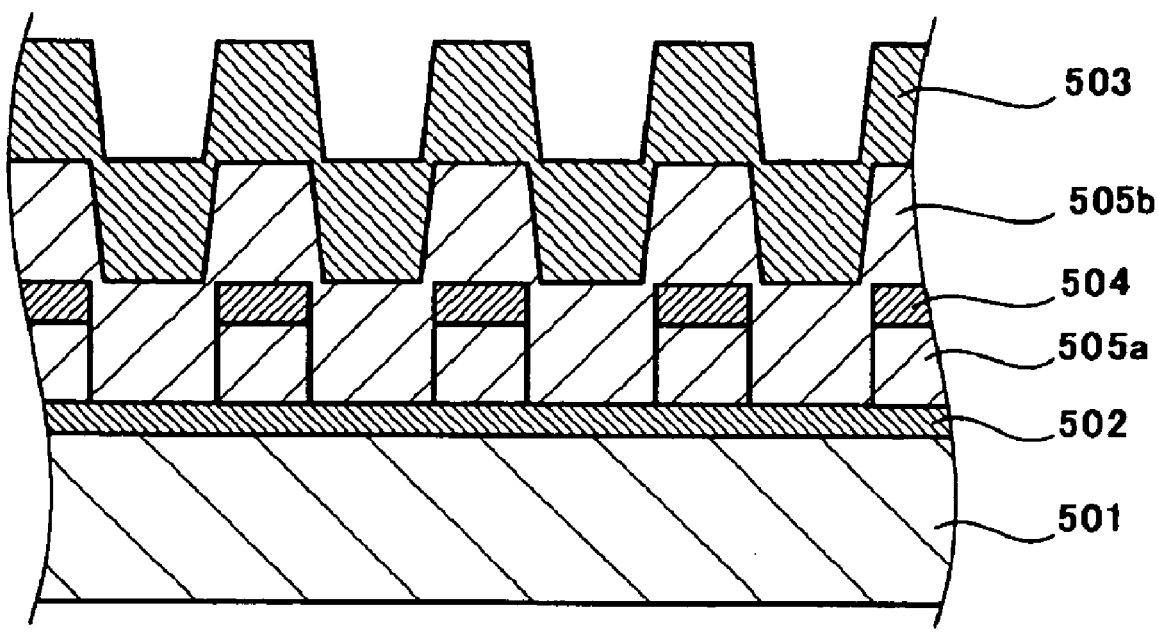
FIG. 8 is a partial sectional view schematically showing the structure of a SIT (1') as an example of a switching element of the present invention.

FIG. 8 shows still another example of a switching element of the present invention, utilizing the porous thin-film-deposition substrate, as to a typical element structure in which the drain electrode has no through-hole as SIT(1'). In SIT(1'), the gate electrode 504 has a through-hole whereas the drain electrode 502 has no through-hole. Except for this, the switching element is provided with the organic charge transferable material layers 505*a* and 505*b*, the substrate 501 and the source electrode 503 and has the same structure, wherein the conditions of the materials used to form the element are also the same as those of SIT(1).

Figure 9:
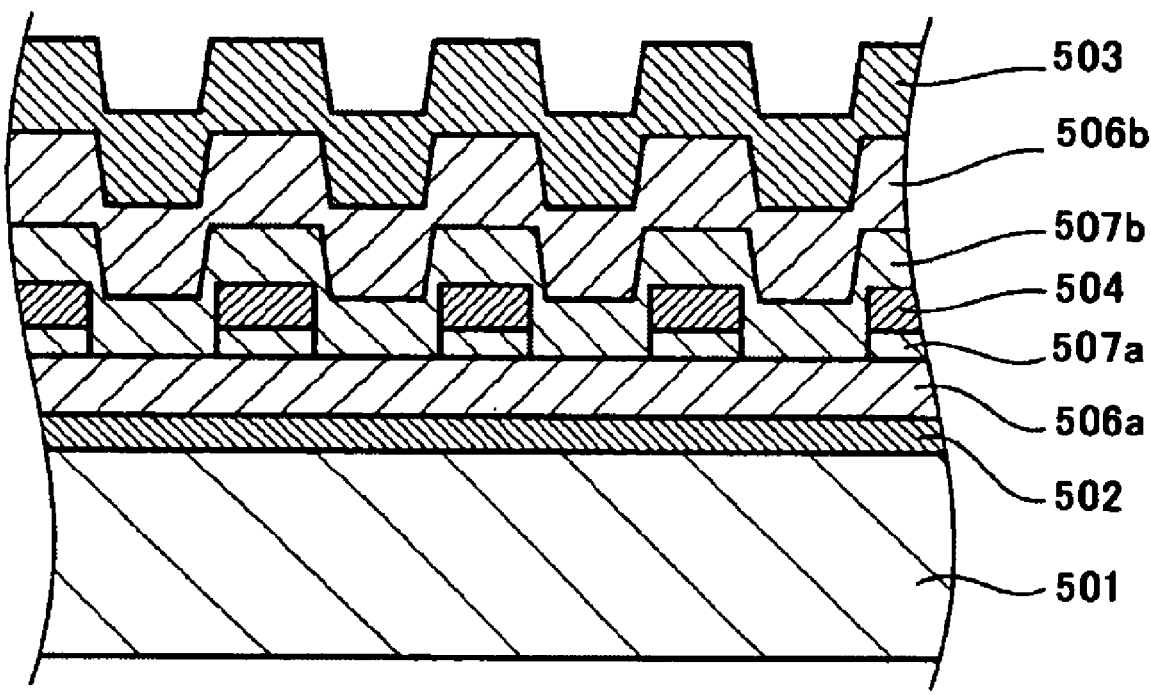
FIG. 9 is a partial sectional view schematically showing the structure of a SIT (2') as an example of a switching element of the present invention.

FIG. 9 shows moreover another example of a switching element of the present invention, in which the drain electrode has no through-hole, that is a SIT(2'). In the element, a gate electrode 504 in SIT(2') has a through-hole, but a drain electrode 502 and a hole transferable organic charge transferable material layer 506*a* have no through-hole. Except for this, the switching element is provided with a substrate 501, an electron transferable organic charge transferable material layers 507*a* and 507*b*, one hole transferable organic charge transferable material layer 506*b* and a source electrode 503, and has the same structure as SIT(2). The conditions of the materials used to constitute the element are also the same as those in SIT(2).

The organic switching element SIT(1) and SIT(2) have better ON/OFF ratio than the organic switching element SIT(1') and SIT(2'), because the flow of carriers is more focused on the gate electrode.

(B) Field Effect Type Transistor (FET)

Figure 10:
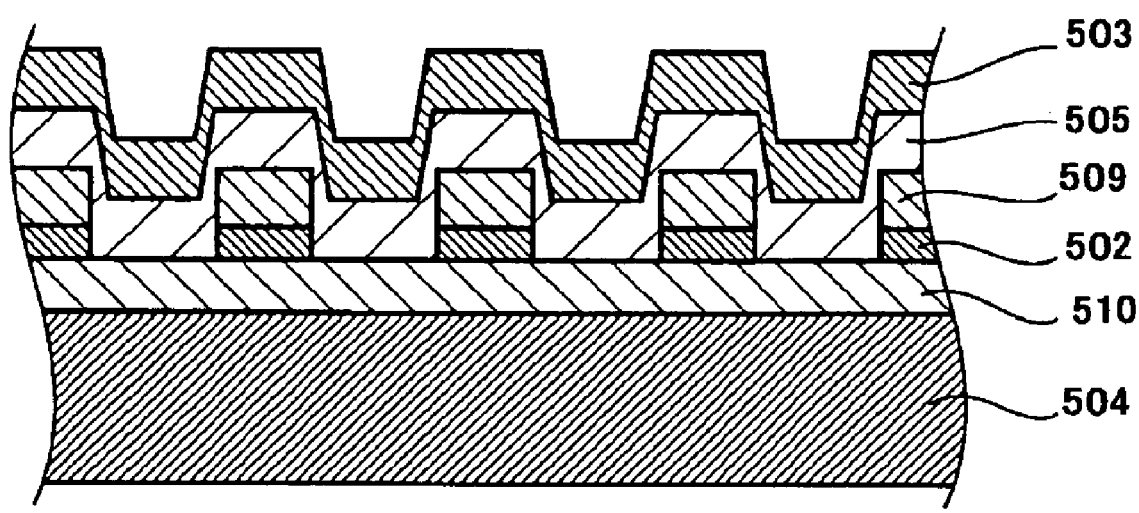
FIG. 10 is a partial sectional view schematically showing the structure of a FET as an example of a switching element of the present invention.

FIG. 10 shows a typical element structure of a FET, as a further example of a switching element of the present invention, utilizing the porous thin-film-deposition substrate. This FET is provided with an electrode pair consisting of a source electrode 503 and a gate electrode 504. Between the paired electrodes, a porous sheet-like drain electrode 502 interposed in such a manner as not to be in contact with these paired electrodes. One surface of the drain electrode 502 is in contact with a gate insulation layer 510 disposed on the gate electrode and other surface is in contact with an insulation layer 509. The insulation layer 509 has a through-hole at substantially the same position at which the through-hole formed for the drain electrode 502 and these through-holes form a common through-hole. An organic charge transferable material layer 505 is filled in between the source electrode 503 and a gate insulation layer 510 and in the common through hole of the insulation layer 509 and the drain electrode 502. The source electrode 503 has a projection structure in which it projects towards the drain electrode 504 at the position of the through-hole.

As the organic charge transferable material layer 505, the same material that is used in SIT(1) may be used. Any material may be used for the source electrode 503, drain electrode 502 and gate electrode 504 without any particular limitation insofar as it has satisfactory conductivity. Metals such as gold, silver, steel, platinum, nickel, tungsten, aluminum, and alloys of these metals, metal oxides such as ITO, fluorine-doped tin oxide and vanadium oxide, graphite, diamond doped with a n-type or p-type dopant, silicon, compound semiconductors and organic conductive materials containing conjugate high-molecular compounds such as polyanilines, polythiophenes and polypyrroles may be used.

The shape and thickness of each of the source electrode 503 and the drain electrode 502 and the size and position of the through-hole may be the same as those in SIT(1). There is no particular limitation to the shape of the gate electrode 504 and the gate electrode 504 may have a sheet form, mesh form, porous form, line form, dot form or comb form. However, the gate electrode 504 is preferably a sheet-like plate electrode.

The gate insulation layer 510 is formed to insulate the drain electrode 502 and organic charge transferable material layer 505 from the gate electrode 504. Any material may be used as the gate insulation layer 510 without any particular limitation insofar as it has insulation. As the material for the gate insulation layer 510, organic polymer films such as polyimides, silicon oxides and metal oxides such as alumina and tantalum oxide are preferable. When the gate insulation layer 510 is a metal oxide film, an oxide film may be newly formed on the surface of the porous gate electrode or the gate electrode may be formed by, for example, aluminum or tantalum and the surface of the gate electrode may be oxidized to form a surface oxide layer. The gate insulation layer 510 more preferably has a higher dielectric constant to decrease drive voltage.

The film thickness of the gate insulation layer 510 is preferably 10 to 100 nm and more preferably 20 to 50 nm, though no particular limitation is imposed on the thickness. When the film is too thin, it is difficult to provide sufficient insulation ability whereas when the film is too thick, problems that, for example, the dive voltage is increased will arise.

The insulation layer 509 preferably uses an insulation material having a low dielectric constant to decrease the parasitic capacitance of the switching element. Examples of the insulation material include high-molecular materials such as polyimides and inorganic materials such as silica ($SiO_2$). Among these materials, it is preferable to use porous films of polyimides, polyimide having voids with a diameter of the order of nanometer, or $SiO_2$.

[2] Method of Producing an Organic Switching Element

Fine pores of the porous thin-film-deposition substrate may be preferably utilized as a common through-hole which a drain electrode, a gate electrode, an insulation layers formed above and below these electrodes, as provided in functional thin films such as a semiconductor layer in the switching element have. In a conventionally adopted method in which a gate electrode gap which is to be a carrier channel is produced by utilizing a phenomenon "bleeding" from a slit vapor deposition mask when the gate electrode is formed by vapor deposition, the gate electrode structure that can be produced by controlling in a lateral direction is the order of 10 μm. This results in that the proportion of the region shielded by the gate electrode in the area of the element becomes so large that the effective area of the element is insufficient. This brings about a large gap width, and causes that the generation of a region where the conductance of the center part of the gap is not modulated by gate voltage. As a result, the problem tends to occur in that the ON/OFF ratio of the current is decreased. The porous thin-film-deposition substrate of the present invention has a thin film structure with fine pores that can solve such a problem. An embodiment of a production method as to the production of a SIT and a FET according to the present invention will be explained in more detail.

(A) Method of Producing SIT(1)

Step(I) Formation of a Drain Electrode

Figure 11:
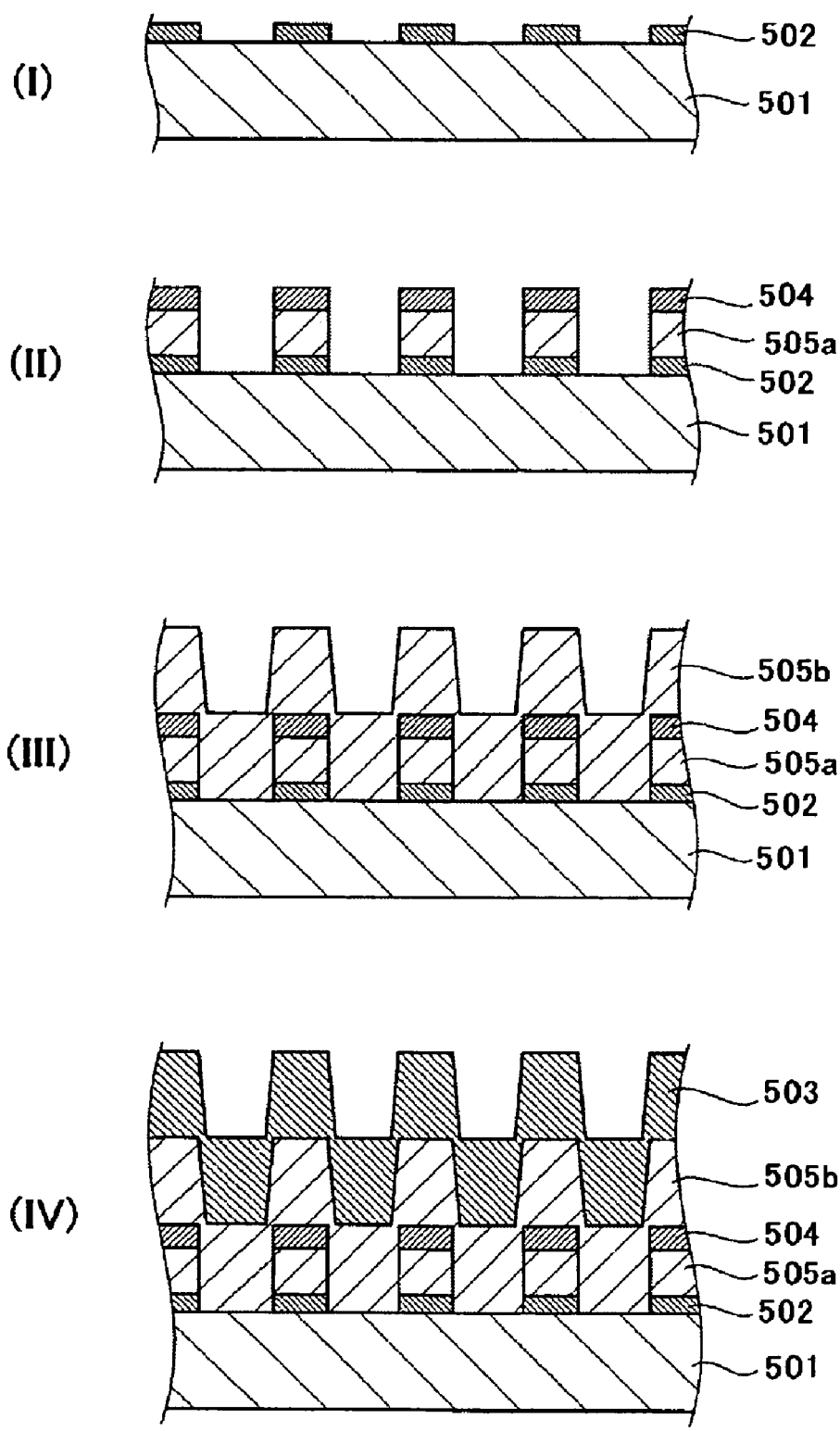
FIG. 11 is a partial sectional view schematically showing a method of producing SIT (1) as an embodiment of producing a switching element of the present invention.

FIG. 11 shows the outline of a method of producing SIT(1). A drain electrode 502 is formed on a substrate 501 according to the following method and a wiring pattern is formed on the drain electrode 502 according to the need. First, the fine particles are stuck to the substrate 501 by a dipping adsorption method. The substrate is subjected to, for example, heat treatment according to the need to fix the fine particles to the substrate 501. The drain electrode 502 is formed by vapor deposition by using the fine particles as a shadow mask and the fine particles are then removed to thereby form a through-hole. As the drain electrode 502, for example, an ITO film may be formed by a sputtering method or a film of a metal such as platinum, gold, palladium, silver, copper, nickel, cobalt, indium and tungsten is formed by a vapor deposition method, sputtering method or plating method. Also, a film of a conductive high-molecular compound such as polyaniline, polypyrrole or polythiophene may be formed by, for example, coating or a field polymerization method.

Step (II) Formation of the Gate Electrode

An organic charge transferable material layer 505a is formed on the drain electrode 2 by CVD, vapor deposition, coating, plating, liquid phase deposition (LPD) method, or the like. At this time, the organic charge transferable material layer 505a is also filled inside of the through-hole of the drain electrode 502. Next, a gate electrode 504 is formed on the organic charge transferable material layer 505a. When a p-type organic conjugate high-molecular material is used as the organic charge transferable material, it is preferable that a film of a metal, such as aluminum, having a small work function be formed by, for example, a vapor deposition method. In addition, a desired wiring pattern is formed on the gate electrode 504 according to the need. After the gate electrode 504 is pattered, the through-hole part of the drain electrode 502 is removed by in-liquid ultrasonic treatment to form through-holes in the organic charge transferable material layer 505a and gate electrode 504.

Step (III) Formation of an Organic Charge Transferable Material Layer

An organic charge transferable material layer 505b is formed by, for example, CVD, vapor deposition, coating, plating or a LPD method. At this time, the organic charge transferable material layer 505b is also filled inside of the through-hole.

Step (IV) Formation of a Source Electrode

A source electrode 503 is formed on the organic charge transferable material layer 505b by, for example, a sputtering method, vapor deposition method, plating, LPD method, or the like, and preferably a vapor deposition method, that is reduced in damage to the organic charge transferable material layer 505b. Besides, a desired pattern is formed on the source electrode 503 according to the need to complete a switching element.

(B) Method of Producing SIT(2)

Figure 12:
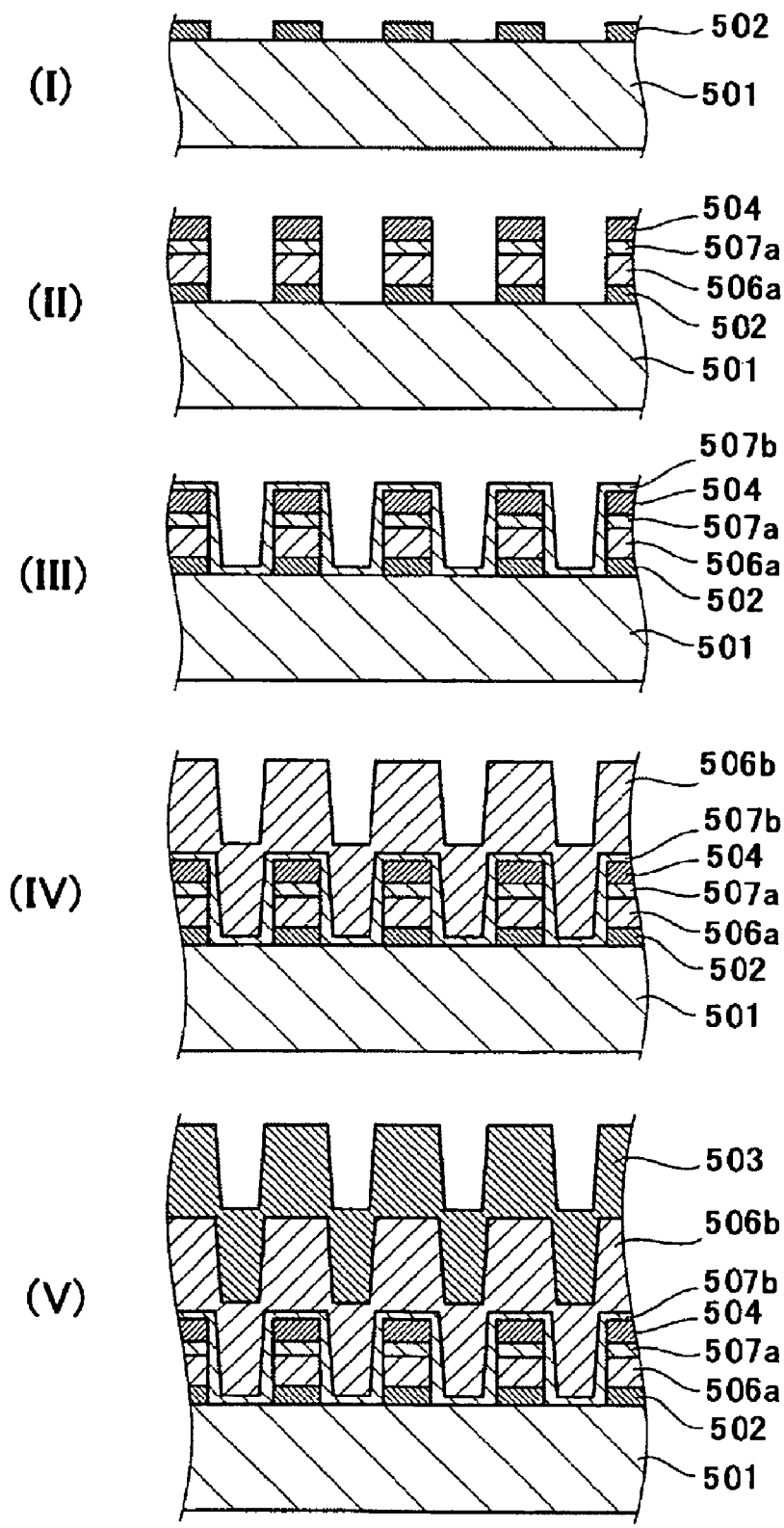
FIG. 12 is a partial sectional view schematically showing a method of producing SIT (2) as an embodiment of producing a switching element of the present invention.

FIG. 12 shows the outline of a method of producing SIT(2). The step (I) of SIT(2) is the same as the step (I) of the above SIT(1).

Step (11) Formation of a Gate Electrode

A p-type organic charge transferable material layer 506a is formed on the drain electrode 502 above a substrate 501 by a CVD, vapor deposition, coating, plating, LPD method, or the like. At this time, the p-type organic charge transferable material layer 506a is filled inside of the through-hole of the drain electrode 502. A n-type organic charge transferable material layer 507a is formed on the p-type organic charge transferable material layer 506a by, for example, a CVD, vapor deposition, coating, plating or LPD method, and preferably a vapor deposition method, that is reduced in damage to the organic charge transferable material layer. A gate electrode 504 is further formed on the n-type organic charge transferable material layer 507a. In this case, a thin film made of a material, such as gold, platinum, ITO or fluorine-doped tin oxide, having a large work function is formed by a vapor deposition method. Besides, a desired pattern is formed on the gate electrode 504 according to the need. After the gate electrode 504 is patterned, the through-hole part of the drain electrode 502 is removed by in-liquid ultrasonic treatment, to form through-holes in the organic charge transferable material layers 506a and 507a and the gate electrode 504.

Step (III) Formation of a N-Type Organic Charge Transferable Material Layer

A n-type organic charge transferable material layer 507b is formed by, for example, a CVD, vapor deposition, coating, plating, or LPD method. At this time, the n-type organic charge transferable material layer 507b is also filled in the through-hole.

Step (IV) Formation of a P-type Organic Charge Transferable Material Layer

A p-type organic charge transferable material layer 506b is formed on the n-type organic charge transferable material layer 507b by, for example, a CVD, vapor deposition, coating, plating, or LPD method.

Step (V) Formation of a Source Electrode

A source electrode 503 is formed on the p-type organic charge transferable material layer 506b by, for example, a sputtering method, vapor deposition method, plating, or LPD method, and preferably a vapor deposition method, that is reduced in damage to the organic charge transferable material layer. In addition, a desired wiring pattern is formed on the source electrode 503 according to the need, to complete a switching element.

(C) Method of Producing a FET

Step (I) Formation of a Gate Electrode

Figure 13:
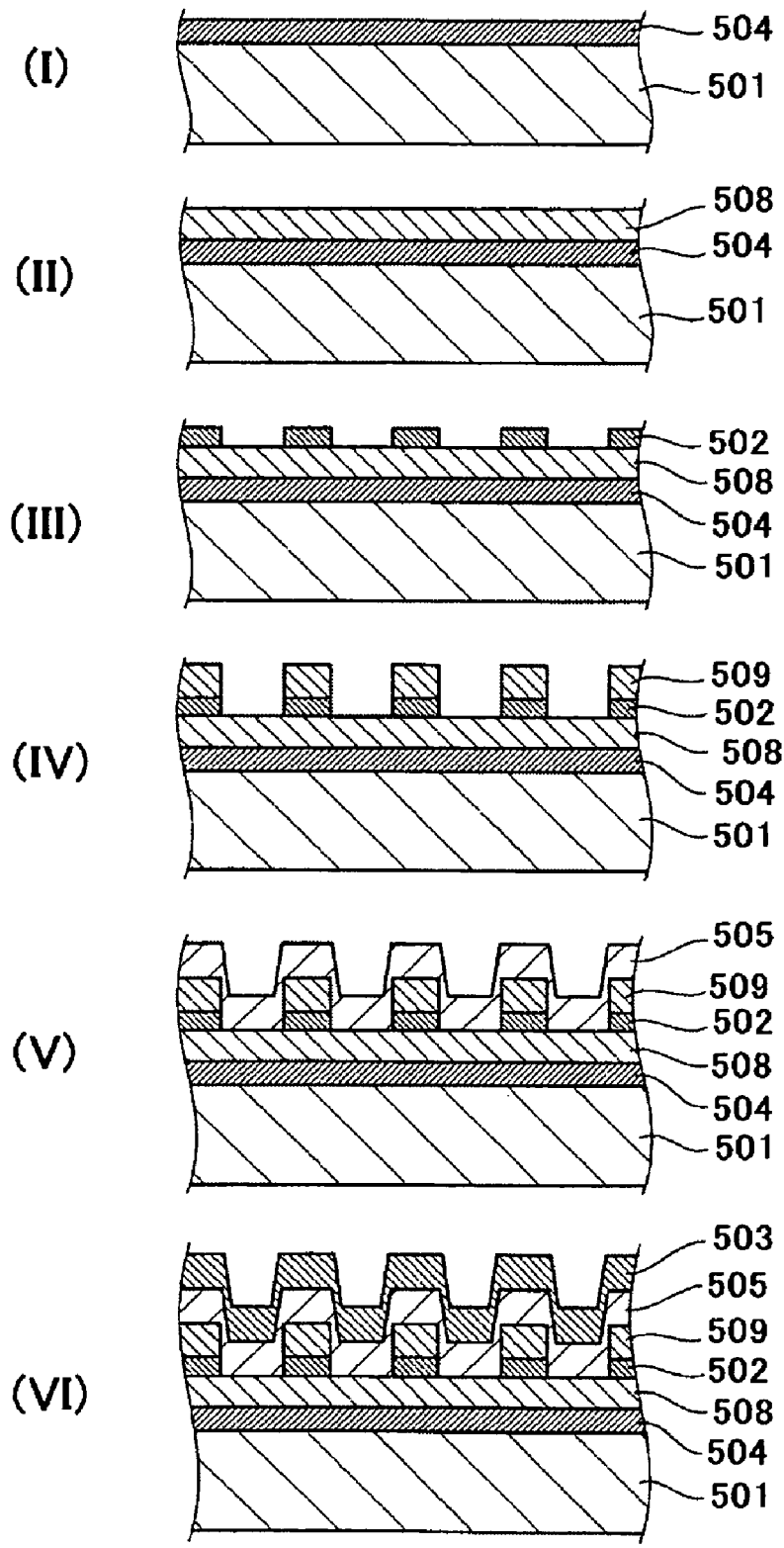
FIG. 13 is a partial sectional view schematically showing a method of producing FET as an embodiment of producing a switching element of the present invention.

FIG. 13 shows the outline of a method of producing a FET. A gate electrode 504 is formed on a substrate 501 and a wiring pattern is formed on the gate electrode 504 according to the need. In the formation of the gate electrode 504, for example, an ITO film is formed by a sputtering method or a film of a metal such as platinum, gold, palladium, silver, copper, nickel, cobalt, indium or tungsten by, for example, a vapor deposition method, sputtering method, or plating. Also, a film of a conductive polymer such as polyaniline, polypyrrole or polythiophene may be formed by coating or an electric field polymerization method.

Step (II) Formation of a Gate Insulation Layer

A gate insulation layer 508 is formed on the gate electrode 504. For example, a SiO$_2$ film is formed by a sputtering method, CVD method, LPD method, or the like; or a polyimide film is formed by, for example, a coating method, vapor deposition method, or electrodeposition method. Alternatively, a surface oxide layer is formed on the surface of the gate electrode, e.g., simply by heat treatment to form a gate insulation layer 508.

Step (III) Formation of a Drain Electrode

A drain electrode 502 is formed on the gate insulation layer 508 in the same method as in the step (I) of the above method of producing SIT(1).

Step (IV) Formation of an Insulation Layer

An insulation thin film 509 is formed on the drain electrode 502 in the same manner as in the step (II) of the above method of producing a FET. A method of forming a through-hole in this insulation thin film 509 is the same as in the step (II) of the above method of producing SIT(1). The steps (V) and (VI) are steps of forming an organic charge transferable material layer 505 and a source electrode 503 and are the same as the steps (III) and (IV) of the method of producing SIT(1).

(D) Method of Producing SIT(1')

Step (I) Formation of a Drain Electrode

Figure 14:
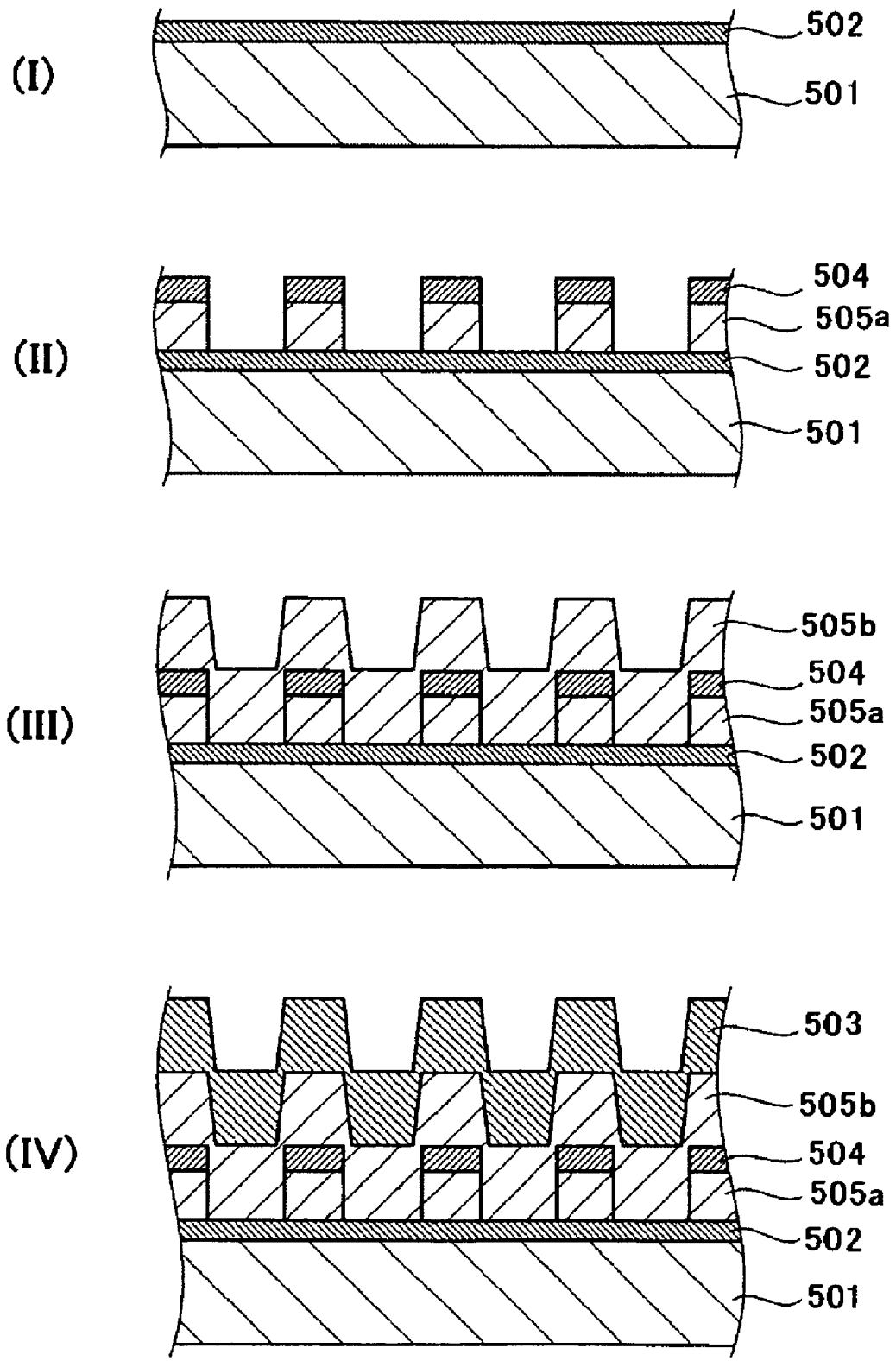
FIG. 14 is a partial sectional view schematically showing a method of producing SIT (1') as an embodiment of producing a switching element of the present invention.

FIG. 14 shows the outline of a method of producing SIT(1'). A drain electrode 502 is formed on a substrate 501 and a wiring pattern is formed on the drain electrode 502 according to the need in the same manner as in the step (I) of the above method of producing SIT(1).

Step (II) Formation of a Gate Electrode

A releasing agent is stuck to the drain electrode 502 by a coating method (spraying method) or the like. The releasing agent is used to develop the selectivity of a peeling part when the thin film is peeled off by in-liquid ultrasonic treatment. Therefore, it is preferable to decrease the area where the releasing agent is stuck and to stick the releasing agent uniformly. Any material may be used as the releasing agent without any particular limitation insofar as it can decrease adhesion between the drain electrode 502 and the organic charge transferable material layer 505a. As the releasing agent, oil, silicone, fluorine type surfactant or the like may be used. An organic charge transferable material layer 505a is formed on the drain electrode to which the releasing agent is stuck by a CVD, vapor deposition, coating, plating, LPD method, or the like. Next, a gate electrode 504 is formed on the organic charge transferable material layer 505a. When a p-type organic conjugate high-molecular material or the like is used as the organic charge transferable material layer 505a, a film of a metal, such as aluminum, having a small work function is formed as the gate electrode 504 by, for example, a vapor deposition method. In addition, a desired wiring pattern is formed on the gate electrode 504 according to the need. After the gate electrode is patterned, the part where the releasing agent is stuck is removed by in-liquid ultrasonic treatment to form through-holes in the organic charge transferable material layer 505a and gate electrode 504. The steps (III) and (IV) are steps of forming an organic charge transferable material layer 505b and a source electrode 503 and are the same as the steps (III) and (IV) of the method of producing SIT(1).

(E) Method of Producing SIT(2')

Step (I) Formation of a Drain Electrode

Figure 15:
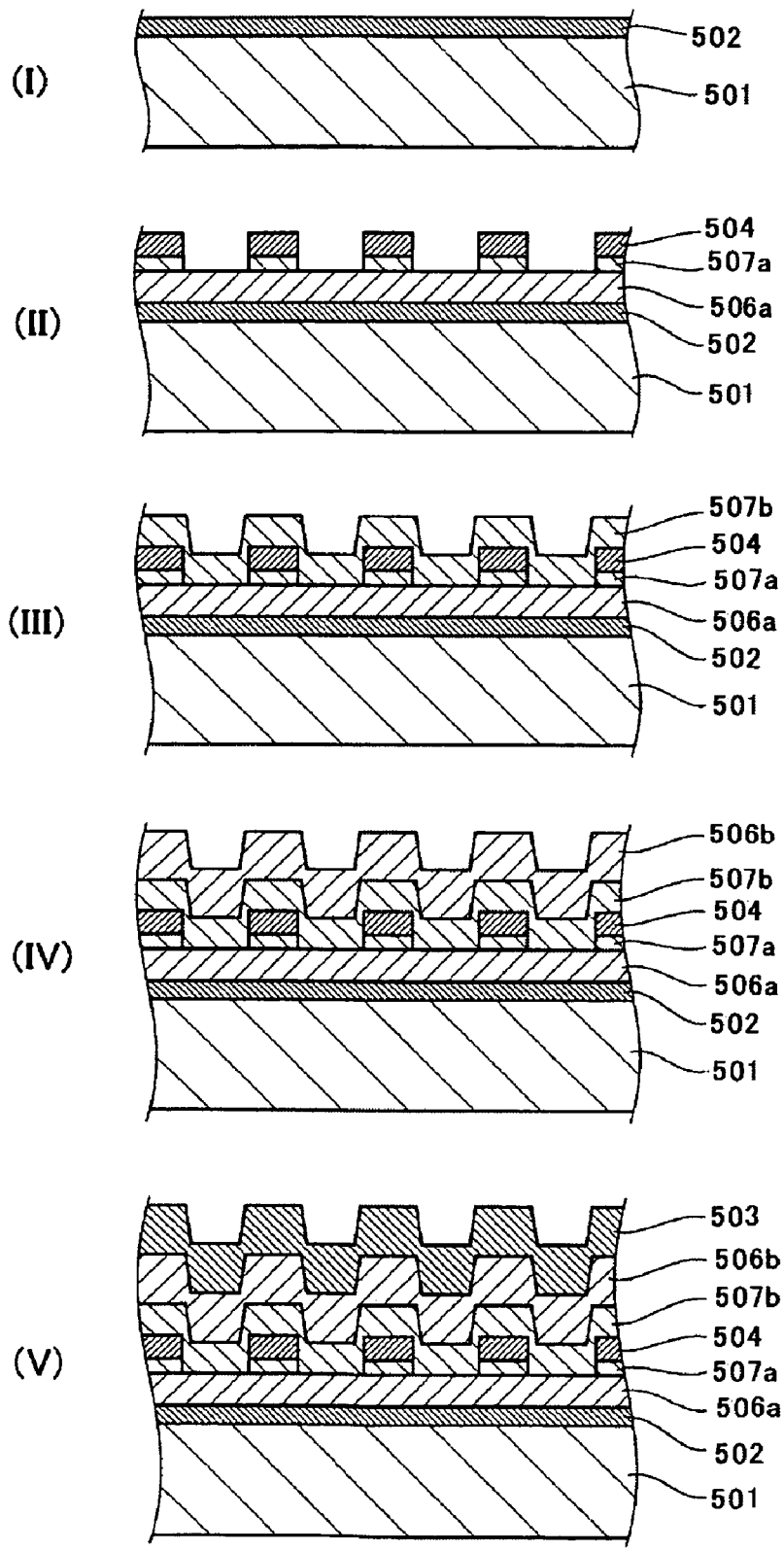
FIG. 15 is a partial sectional view schematically showing a method of producing SIT (2') as an embodiment of producing a switching element of the present invention.

The step (I) in FIG. 15 shows the outline of a method of producing SIT(2'). The step (I) is the same as the step (I) of the above method of producing SIT(1').

Step (II) Formation of a Gate Electrode

A p-type organic charge transferable material layer 506a is formed on the drain electrode 502 above the substrate 501 by, for example, a CVD method, vapor deposition, coating, plating, or LPD method. Next, a releasing agent is stuck to the p-type organic charge transferable material layer 506a. The sticking method, the materials of the releasing agent and the like are the same as those in the step (II) of the method of producing SIT(1'). A n-type organic charge transferable material layer 507a is formed on the p-type organic transferable material layer 506a to which the releasing agent is stuck by a CVD, vapor deposition, coating, plating, LPD method, or the like, and preferably a vapor deposition method that is reduced in damages to the charge transferable material layer. In addition, a gate electrode 504 is formed on the n-type organic charge transferable material layer 507a. In this case, a thin film of a material, such as gold, platinum, ITO or fluorine-doped tin oxide, having a large work function is formed as the gate electrode 504 by, for example, a vapor deposition method. In addition, a desired wiring pattern is formed on the gate electrode 504 according to the need. After the gate electrode is patterned, the part where the releasing agent is stuck is removed by in-liquid ultrasonic treatment to form through-holes for the organic charge transferable material layer 507*a* and gate electrode 504. The steps (III) to (V) are steps of forming an organic charge transferable material layer 507*b*, a p-type organic charge transferable material layer 506*b* and a source electrode 503 and are the same as the steps (III) to (V) of the method of producing SIT(2).

[3] Switching Element Array

Figure 16:
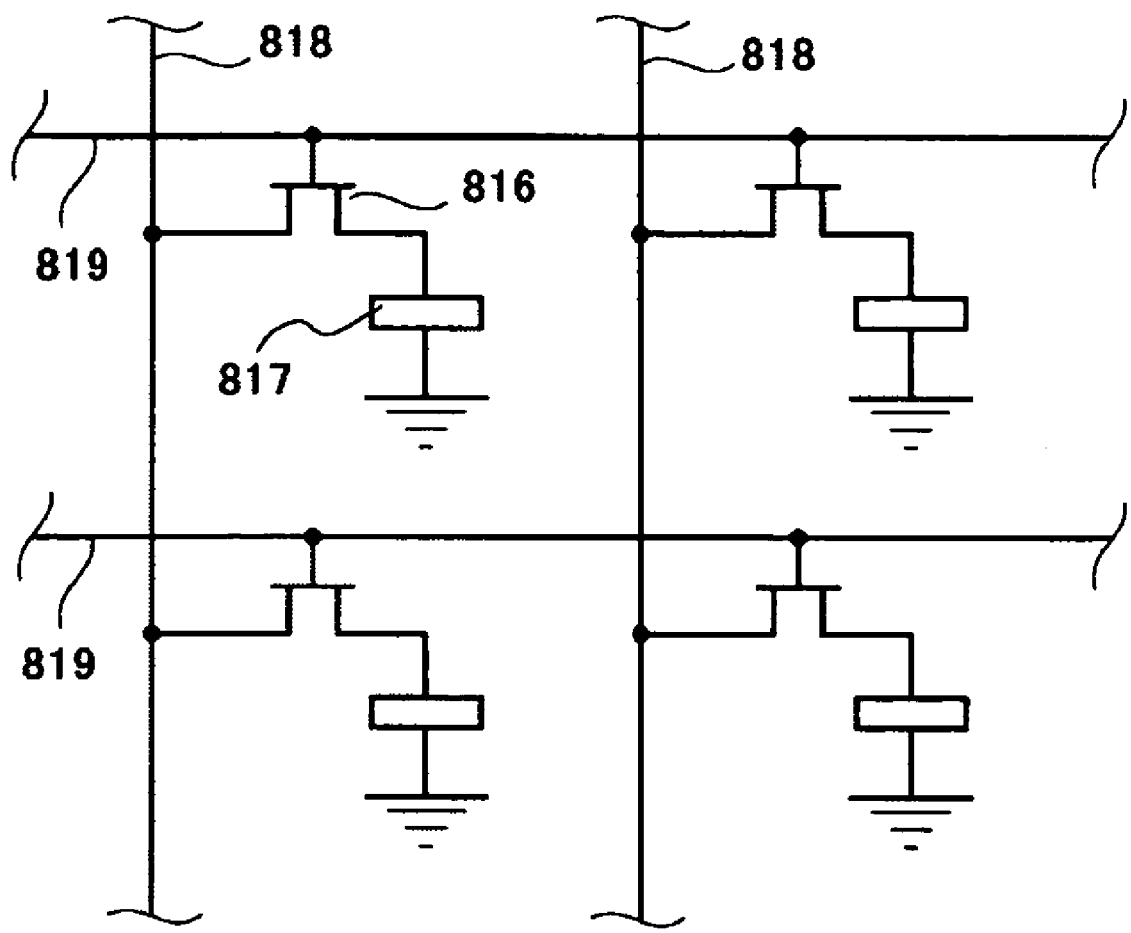
FIG. 16 is a partial wiring diagram showing an example of a switching element array to drive an EC display.

The above switching element may be arranged matrix-wise to constitute a switching element array for driving display element such as a liquid crystal display, electrophoretic display, electrochromic (EC) display, or EL display. FIG. 16 is a wiring diagram showing one example of a switching element array that drives an EC display and FIG. 17 shows its element arrangement.

In FIG. 16, scanning lines 818 and signal lines 819 are distributed lattice-wise and a switching element 816 is connected with each cross-coupled scanning line 818 and signal line 819. Further, an EC element 817 is connected with each switching element. In FIG. 17, the scanning lines 818 and the signal lines 819 are distributed lattice-wise, each switching element 816 is arranged on each scanning line 818 and each EC element 817 is arranged upstream of each switching element 816.

Figure 17:
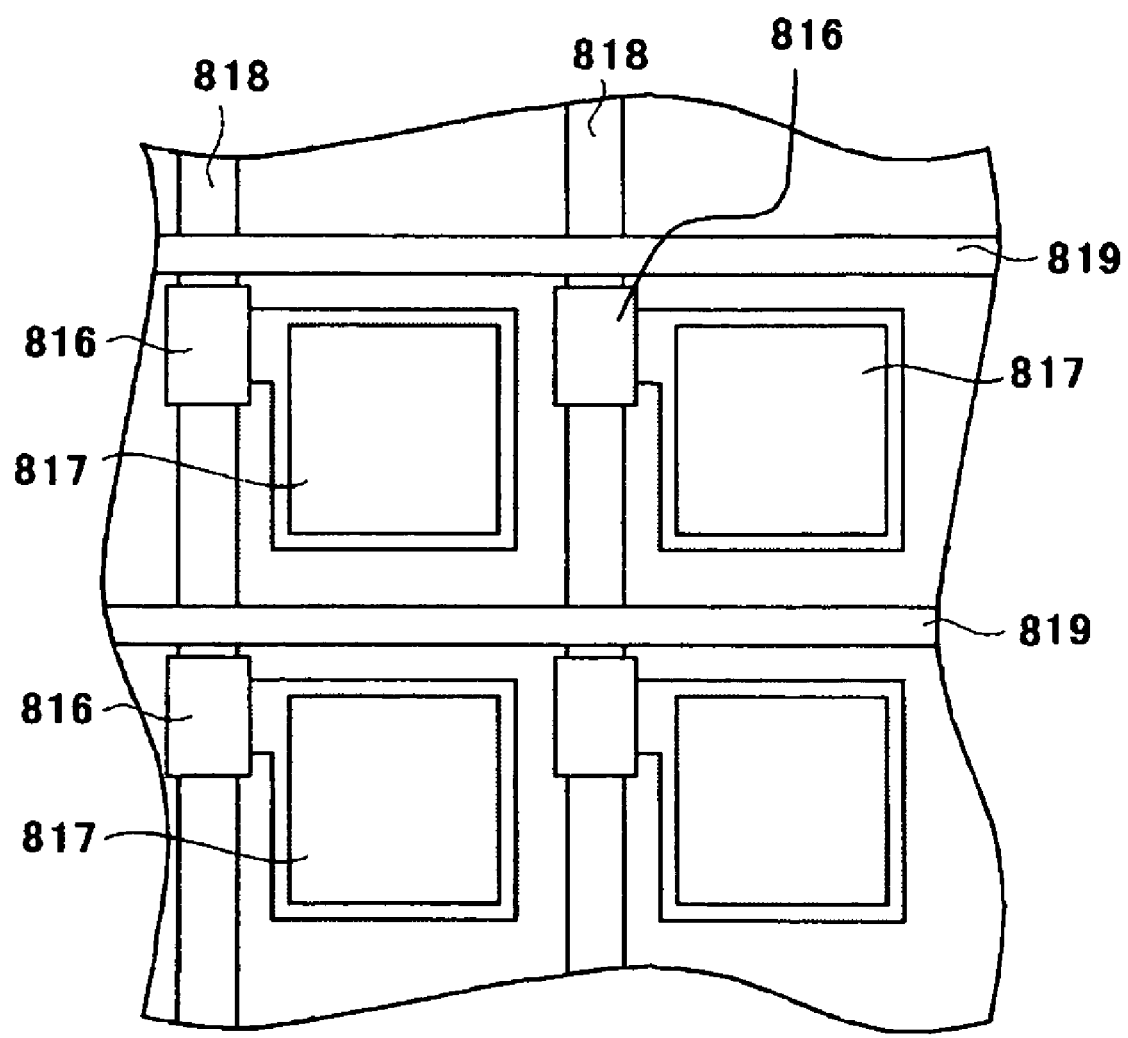
FIG. 17 is a partial element-arranging diagram showing an example of a switching element array to drive an EC display.

In the case of a switching element array driving a current driving type display device such as an EC display like this, an arrangement in which switching element are laminated behind display devices unlike the layout drawing of FIG. 17 is also preferable. A switching element array like this can be produced by appropriately combining a usual photolithographic step and the aforementioned step of forming a through-hole.

The switching element of the present invention is useful as a switching element that drives a display device. Examples of the displays using the switching element of the present invention include a liquid crystal display, EL display, polymer dispersion type (PDLC) display, electrophoretic display, and the like. Also, the switching element of the present invention may be used in various electronic devices such as integrated circuit (IC) tags, radio frequency (RF) tags, IC cards, memories, various sensors (for example, gas sensors and pH sensors).

Next, a method of producing an electron emitting element of the present invention will be explained in detail.

Figure 18:
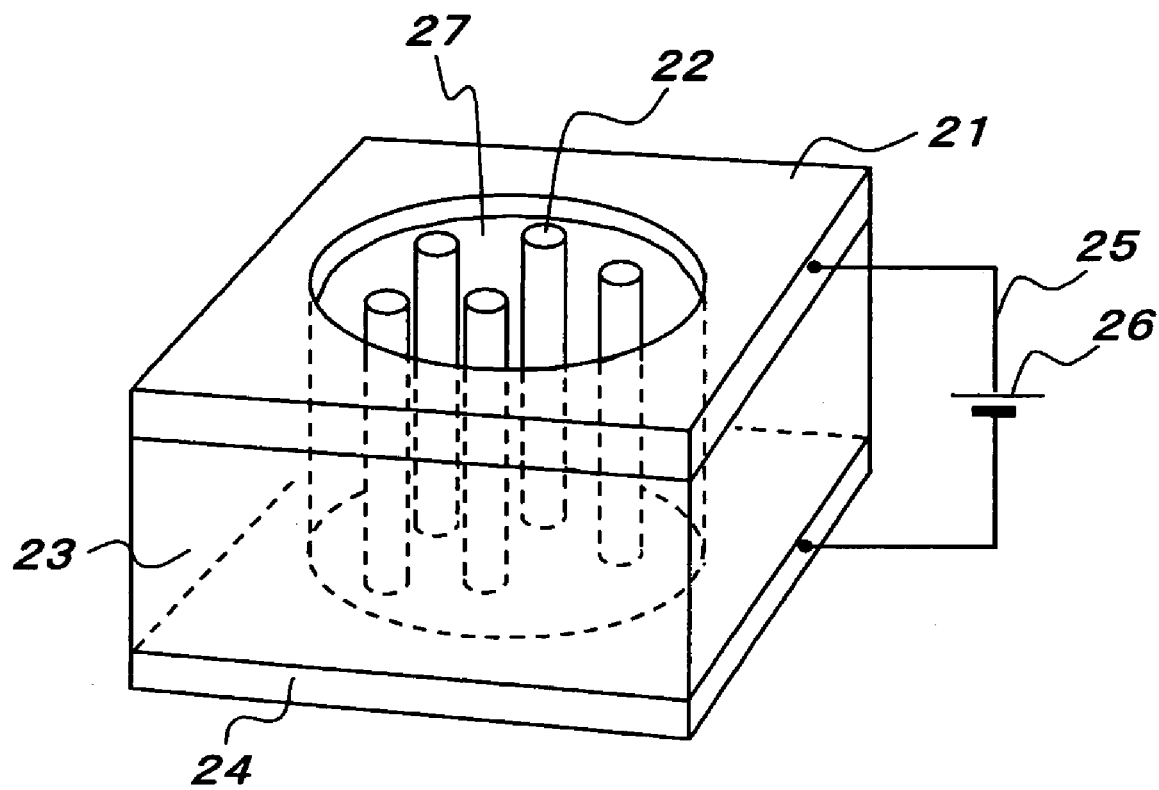
FIG. 18 is a perspective view schematically showing one example of an electron emitting element of the present invention.

The electron emitting element is an element which is provided with a structure serving as an electron gun (emitter) therein to emit electrons, and is therefore utilized for a field emitting type display (FED) and the like by making use of the electron emission. The electron emitting element of the present invention has (i) a substrate (at least one layer of a base film formed thereon), (ii) another thin film layer, formed on the base film, having fine pores arranged substantially at an equal interval, and (iii) an aggregate of needle-shaped conductors formed on each bottom face of the fine pores. In this element, the fine pores of the film layer are formed by removing fine particles from the substrate, in that the fine particles are once placed onto the surface of the base film on the substrate in accordance with a dipping adsorption method, and then the film layer is deposited on the fine-particle-placed substrate. The outline of an example of the structure is schematically shown in FIG. 18. The electron emitting element of FIG. 18 has a laminate structure in which a dielectric (insulation) layer 23 and a grid electrode layer (gate electrode) 21 are disposed on a cathode electrode layer 24. The element also has a structure in which a part of the grid electrode layer 21 and dielectric layer 23 is provided with an opening part 27 and plural needle-shaped emitters 22 are disposed in the opening part 27. The cathode electrode 24 and the grid electrode 21 are electrically connected with each other through a wiring 25. An electric field is applied from a power source 26 to emit electron rays from the emitter 22. Though the element structure is represented by a single unit in FIG. 18, the electron emitting element preferably has a structure in which a large number of such unit element structures are joined on one substrate.

An electron emitting element has difficulties in fining by conventional production methods, because an emitter is so fine that its processing is difficult and the element needs the formation of a porous structure having stable opening parts. A novel method of the present invention can solve such a problem, i.e., it is possible to form opening parts with high accuracy, thereby disposing an emitter stably in a simple and economical method. That is, a method of producing an electron emitting element of the present invention includes the steps of: (i) adding a catalyst metal on a substrate, (ii) placing fine particles onto the catalyst-added substrate, (iii) depositing a thin film, including at least one layer, on the fine-particle-placed substrate, (iv) removing the fine particles to form fine pores in the film, and (v) growing needle-shaped conductors as an aggregate thereof on the catalyst metal that is exposed on a bottom face of the fine pore.

Figure 19:
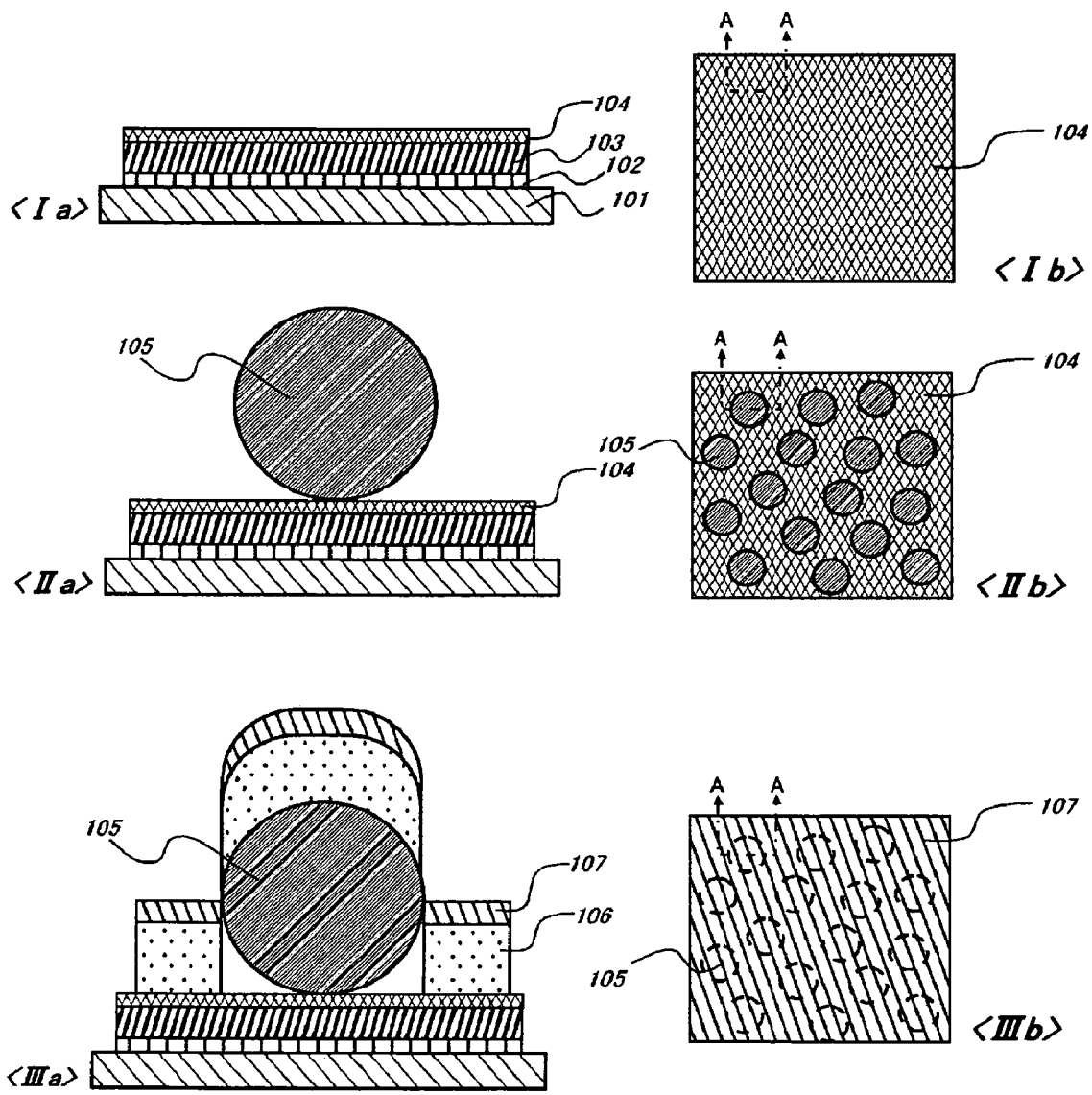
FIG. 19 is a schematic view showing a part of steps for producing an electron emitting element in a method of the present invention.

One example of the steps of producing an electron emitting element in the present invention will be explained with reference to FIGS. 19 and 20. FIG. 19 is a schematic view showing a part of the steps of producing an electron emitting element in the present invention. In FIG. 19, the steps are divided into steps Ia, IIa and IIIa each shown by a partial sectional view, and each corresponding step is shown by a partial plan view as steps Ib, IIb and IIIb. The partial sectional views of these steps Ia, IIa and IIIa are enlarged sectional views corresponding to sections along the line A-A of the views showing the steps Ib, IIb and IIIb.

A first step (step Ia and step Ib) is a step of providing a catalyst metal 104 to a substrate 101. At this time, thin film layers, for example, an undercoat layer 102 and a cathode electrode 103, having desired functions when the element is completed may be disposed.

A second step (step IIa and step IIb) is a step of disposing fine particles 105 on the surface of the substrate.

A third step (step IIIa and step IIIb) is a step of depositing, as thin films, layers having desired functions when the element is completed. For example, a dielectric (insulation) layer 106 and a grid electrode layer 107 may be deposited and layers having other functions may be further deposited.

Figure 20:
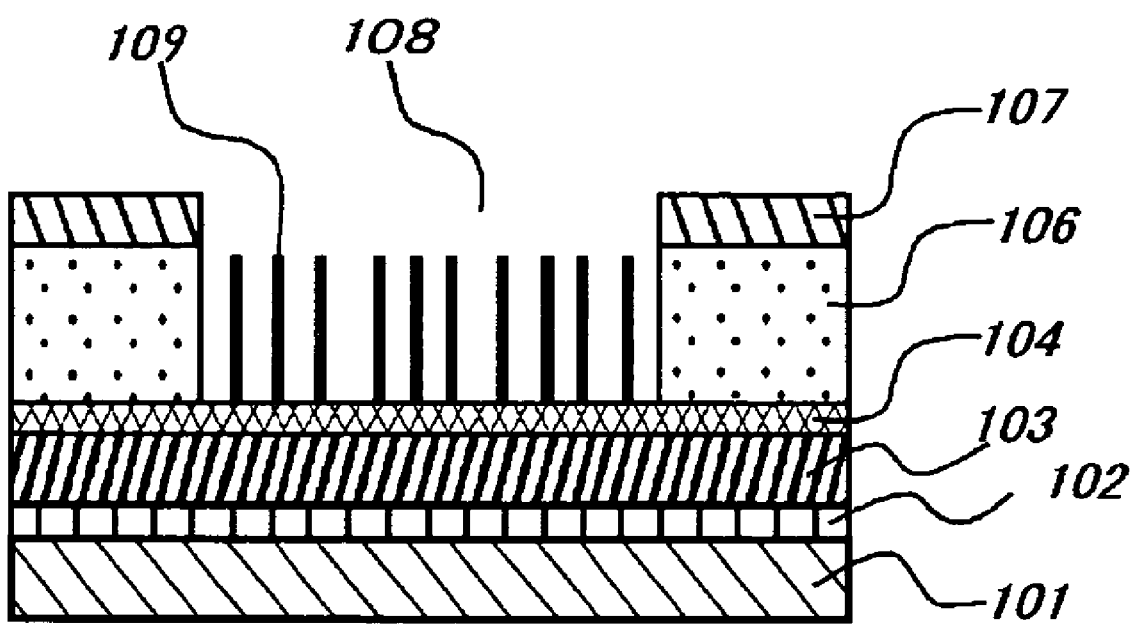
FIG. 20 is a partial sectional view schematically showing one example of an electron emitting element of the present invention.

A fourth step is a step of removing the fine particles 105 disposed in the second step from the thin-film-deposition substrate formed in the third step, with the intention of forming fine pores (through-holes) 108 shown in FIG. 20.

FIG. 20 illustrating a fifth step shows a step of growing a needle-like conductor which is to be an emitter 109 and is a more enlarged sectional view for explaining the steps Ia to IIIa in FIG. 19. The porous thin-film-deposition substrate from which the fine particles have been removed is placed into the situation where the catalyst metal surface is exposed at the bottom face of the formed through-hole 108, whereby the needle-like conductor can be selectively grown on the catalyst.

In a method of the present invention, the materials and positions of the thin films to be formed on the substrate may be determined appropriately according to the purpose. For example, the thin film may be an aggregate of nanowires shown in FIG. 21. A layer of this nanowire aggregate may be formed in the following manner: in the above process, the catalyst metal is applied directly onto the substrate 101 in the first step, a protective film (protective layer) 110 is deposited as the thin film in the third step and other steps are carried out in the same manner as above. The nanowire aggregate can be made into not only the electron emitting element but also ultrasonic wave vacuum tube amplifiers, nanoscale conductive connectors, tactile sensors and micro-interconnection circuit devices.

Any material may be used as the material of the substrate without any particular limitation insofar as it can support the electron emitting element. The material for the substrate is preferably highly adhesive to materials to be disposed on the substrate. For example, when the catalyst metal is provided to the substrate, those which are highly adhesive to the catalyst metal are preferable, and when electrode are disposed on the substrate, those which are highly adhesive to the electrode materials are preferable.

As the substrate used for the electron emitting element of the present invention, for example, glass, metal oxides (for example, aluminum oxide, silica ($SiO_2$) and (ITO)) and plastic films (for example, a polyethylene terephthalate (PET) film, polyethylene naphthalate (PEN) film and polycarbonate film) coated with these metal oxides are preferable.

When the adhesion of the substrate to materials (for example, a catalyst metal and electrode) disposed on the substrate is insufficient, it affects the yield in the production. An undercoat layer may be therefore formed between the substrate and the materials disposed on the substrate to secure satisfactory adhesion. The materials used for the undercoat layer may be properly selected corresponding to the substrate and the materials (for example, a catalyst metals and electrode) disposed on the substrate. When, for example, the substrate is glass, chromium is preferable. The thickness of the substrate is preferably 0.1 mm to 10 mm if the substrate material is glass and 1 µm to 1 mm if the substrate is a film substrate.

The catalyst metal used for the electron emitting element of the present invention is preferably those appropriate to grow the needle-like conductor. For example, iron, cobalt, nickel, vanadium, molybdenum, rhodium, palladium and complexes of these materials are preferable. As to the method of applying the catalyst metal, the catalyst metal may be applied by various thin film forming methods including spraying method and various thin film patterning methods such as a sputtering method, vapor deposition method, plating method, coating method. An appropriate method may be selected from these methods corresponding to the material to be used. Although the catalyst metal may be applied as a uniform thin film layer (for example, 1 nm to 100 nm), it may be applied by patterning corresponding to the structure required when the element is completed, or it may not be formed as a thin film layer but may be diffused on the substrate to apply it. It is preferable to take the adhesion and affinity to fine particles into account because the fine particles may be disposed on the catalyst metal.

As a method of disposing the fine particles on the substrate, a dipping adsorption method, bar coating method, squeegee coating method, spin coating method, ink jet method, spraying method and the like can be applied. Among these methods, a dipping adsorption method enabling the formation of a more uniform and finer porous thin-film structure is preferably employed in this embodiment of the present invention. For producing an electron emitting element of the present invention, the fine particles may be disposed on the catalyst metal applied to the surface of the substrate. It is therefore preferable to use fine particles having electrostatic interaction with or adhesion to the catalyst metal. Also, it is possible to make the fine particles have adhesion to the substrate by providing the surface of the fine particles with a functional group having high affinity to the fine particles. When, for example, a thio group is added, high affinity to gold, silver, platinum or the like can be provided. Other than the above, it is preferable to add, for example, a carboxyl group, trialkylammonium group, amino group, hydroxyl group or sulfonic acid group may be added according to the properties of the surface of the substrate.

In connection with "Treatment after placing fine particles" "Dispersion liquid" "Fine particles" "Thin film" "Removal of fine particles", they are adopted also for producing an electron emitting element as described in the corresponding clauses respectively. Further, as to fine pore, it is the same as described in the above clause "Fine structure".

A preferable hole diameter of the opening part and a preferable range of the coefficient of variation in the hole diameter are the same as those of the fine particles. When the opening diameter is too small, the growth of the needle-like conductor is hindered, whereas when the opening diameter is too large, this causes the size and orientation of the needle-like conductor to be disordered. If the coefficient of variation in the opening diameter is too large, and, specifically if the shapes of the opening parts are not stable, this is a cause of a reduction in the uniformity of electron emitting characteristics. Also, the opening ratio of the opening parts (Total area of the opening parts×100/Total area of the region where the through-holes are formed) is preferably 10 to 90% and more preferably 20 to 80%. When the opening ratio is too small, this is a cause of an increase in threshold value because of discharging difficulty. When the opening ratio is too large on the other hand, this is a cause of reduced discharge efficiency because the resistance of the electrode increases.

As mentioned above, the fine pores of an electron emitting element of the present invention are obtained by a novel production method using fine particles, and hence the pores can be different from the fine particles produced using the usual processing technologies in positions and arrangement. In the processing technologies using EBs (electron beams), the fine pores are arranged regularly (typically, the pores are arranged crosswise in lines) because of limits to a processing device and processing process.

The fine pores of an electron emitting element of the present invention, as described above, are formed at equal intervals in relation to Debye length, and they can be disposed freely except for the above. Therefore it is possible to attain this new disposition of fine pores without any limitation to production. The production costs can be dropped when the fine pores are formed at optional positions except for the arrangement at equal intervals. Here, it is only required for these fine pores to be disposed at substantially equal intervals and these intervals may be dispersed (for example, the coefficient of variation may be about 0% to 100%, and preferably 0% to 40%) as long as the performance of the element to be produced is not impaired.

The electron emitting element of the present invention preferably has cathodes such as a cathode electrode and grid (gate) electrode. As the cathode electrode, any material including platinum, tantalum, chromium, aluminum, silver, and the like may be used without any particular limitation insofar as it has conductivity. As the grid electrode, any material including platinum, tantalum, chromium, aluminum, silver, and the like may be used without any particular limitation insofar as it has conductivity. Also, as to the shape of the electrode, the electrode may have any form insofar as it has a sheet form, and may have a plane form, curved form, cylindrical form, or mesh form.

Any material may be used as a needle-like conductor without any particular limitation insofar as it is superior in electron emitting ability as the emitter. It is preferable to use nanowires, whiskers, and the like that grow on a catalyst metal as a starting point. No particular limitation is imposed on the shape of the emitter, and the emitter preferably has a needle-like shape having a sharp edge, and these needle-like materials preferably face the same directions, and preferably have the same heights. These needle-like materials can constitute uniform electron emitting sources when they face the same directions. Also, the electrodes can be shortened, and these materials enable emission of electrons at lower voltages, when the distances between the points of these materials.

As the needle-like conductor, for example, a carbon nanotube may be used. The carbon nanotube used in the present invention desirably has a smaller tube diameter. When the nanotube is narrower, an electric field can be easily focused and the nanotube can emit electrons at lower voltages. The tube diameter is preferably 50 nm or less, more preferably 10 nm or less and still more preferably 5 nm or less. There is no particular limitation to the number of layers. However, if the tube diameter is decreased, the number of layers can be decreased naturally. Also, the density of the carbon nanotubes is preferably 1 to 1,000,000 tubes/$\mu m^2$ and more preferably 100 to 100,000 tubes/$\mu m^2$. Other than the above, as the columnar conductive group, an aggregate of columnar crystals of β-tungsten is preferably used (see JP-A-8-264108).

The needle-like conductor may be grown by the usual method. It is preferable to use, for example, a method in which whisker crystals of carbon nanotubes are grown on the catalyst metal by a plasma CVD method. As the supply gas in the plasma CVD method, a mixture gas of hydrogen and methane or the like is preferably used. It is also preferable to grow crystals with directly applying d.c. bias voltage to a cathode electrode disposed on the substrate.

More detailed explanations will be made as to the case of using a carbon nanotube as one of preferred embodiments of an electron emitting element of the present invention.

The problems of an electron emitting element using a carbon nanotube are that electron emitting characteristics of pixels among them are unstable, so that the luminance of each pixel disperses when displaying an image. In order to correct the dispersion, it cannot obtain image quality having satisfactory gradation due to sacrificing the width (dynamic range) of luminance gradation. In other words, if electron sources reduced in dispersion among pixels could be attained, the aforementioned problems concerning the lack of gradation would be solved and an image that has a wide dynamic range and an energetic feel could be displayed.

In order to solve this problem, there is the idea that a film of carbon nanotubes having the same electron emitting characteristics is formed uniformly and flatly on the entire surface of the cathode by a CVD method. However, the size of a pixel in a display is tens to hundreds μms and it is therefore difficult to grow carbon nanotubes such that they are vertically oriented uniformly at a high density on the entire area of the pixel.

Fine pores formed by a method of the present invention respectively have an opening diameter of, for instance, tens to hundreds nm. It is therefore possible to arrange carbon nanotubes vertically at high densities. Also, because the intervals between fine particles are uniform and the number (density) of the fine pores can be controlled, the intended electron emitting characteristics can be obtained without any dispersion of qualities. Among these carbon nanotubes, a double structure nanotube (DWNT) and a multilayer structure nanotube (MWNT) which are superior in electron emitting characteristics and in reliability such as life are combined to make an excellent electron emitting element.

Further it is difficult to obtain fine pores having such a size as to be obtained in the production method of the patent application of this case, by other production methods (for example, photolithography, EB (electron beam) lithography). Even if possible, these conventional methods need very expensive nano processing technologies and much processing time, and are therefore unfit to the production of a device having a large area.

An electron emitting element of the present is preferably provided with an insulation layer (dielectric layer) parting the cathode electrode from the grid electrode. Any material may be used as the insulation layer without any particular limitation insofar as it can cut off an electric influence of each opening part. As the material of the insulation layer, silica ($SiO_2$), SiN, SiON, or the like may be used. The thickness of the insulation layer is preferably designed to be 10 nm to 10 μm.

Figure 22:
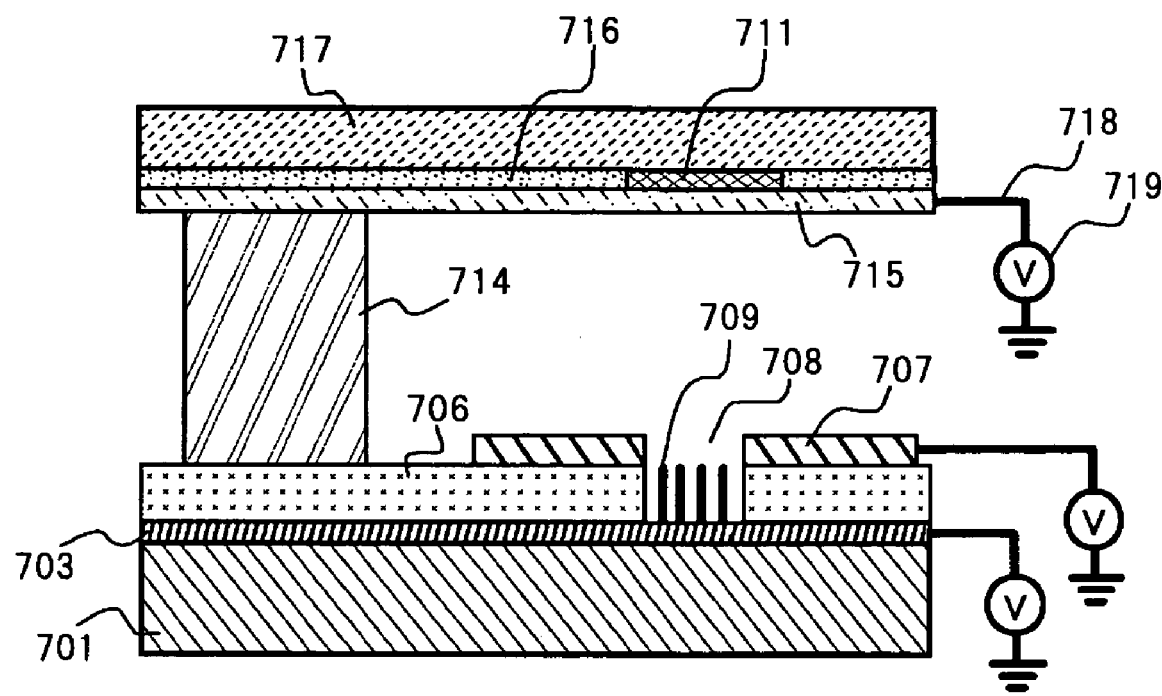
FIG. 22 is a partial sectional view schematically showing one example of a display element of the present invention.

One example of a part of field emission type displays (field emission display: FED) is schematically shown in FIG. 22 as a display element provided with the electron emitting element of the present invention.

A cathode 703 is disposed on a substrate 701 (cathode substrate) and a dielectric (insulation) layer 706 is disposed on the cathode 703. An opening part 708 is formed on a part of the cathode electrode 703 and dielectric layer 706. Many emitters 709 are fixed on the bottom face of the opening part 708 to form an electron emitting element.

On the other hand, a black matrix layer 716 is disposed on an anode substrate 717, a fluorescent body 711 is formed in a part of the black matrix 716 and the fluorescent body 711 is coated with an anode electrode 715 to form an anode laminate substrate. The material and thickness of the anode substrate 717 are designed to be the same as those of the substrate 701 of the electron emitting element. The material and thickness of the anode electrode 715 are designed to be the same as those of the cathode electrode 703. As the black matrix 716 and the fluorescent body 711, the usual one and usual method may be used.

The electron emitting element and the anode laminate substrate are joined with each other in such a relation that the both are facing each other through a spacer 714. At this time, the opening part 708 and the fluorescent body 711 are preferably disposed at substantially the opposite corresponding positions such that the electrons emitted from the emitter 709 by the field applied from a power source 719 through a wiring 718 bump against the fluorescent body 711 to emit light. In this figure, the display element is seen to have only one opening part 708. However, it is preferable that, actually, many opening parts 708 be disposed in the element and many emitters 709 be respectively secured to each bottom of the opening parts 708. Also, a gate electrode 707 is preferably disposed at a position close to the emitter 709 and also, it is preferable to use whisker crystals, such as carbon nanotubes, having a very high aspect ratio.

Figure 21:
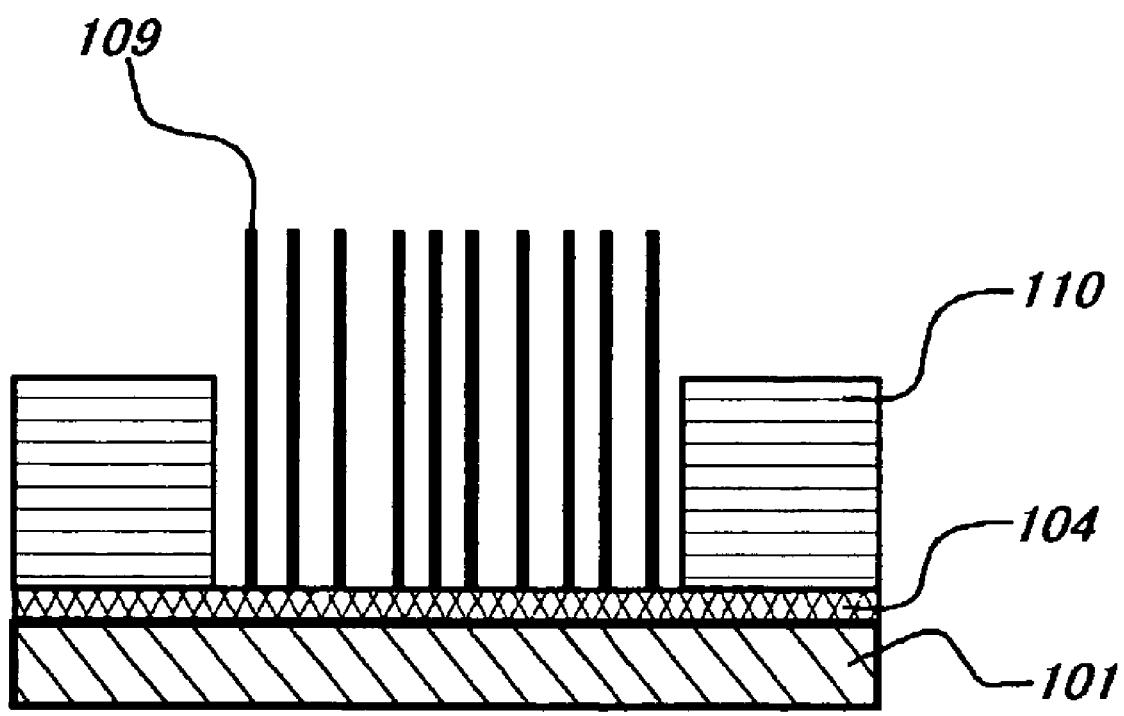
FIG. 21 is a partial sectional view schematically showing one example of a nanowire aggregate.

Display devices for which the electron emitting element of the present invention is preferably used are not limited to the display element of FIG. 21 and the electron emitting element of the present invention may be preferably used for a variety of display devices, such as FEDs, having other structures and other electronic devices.

According to a method of the present invention, fine particles used as a shadow mask can be removed without breaking the thin film on the substrate, the shapes and sizes of the fine pores can be uniform and stable. As a result, a porous thin-film-deposition substrate can be produced inexpensively and simply, at a moderate temperature while controlling the hole diameter and hole density. Moreover, the present invention can provide a switching element that has uniform and sufficiently small gate holes, is operated at a low voltage, is superior in frequency characteristics and has good switching characteristics by utilizing this porous thin-film-deposition substrate. Also, a higher-order structure organic switching element can be produced easily by introducing an organic semiconductor into a thin film. Also, the switching element is widely applicable in the fields of electronic devices and optical materials. Further, when the switching element of the present invention is applied to a switching element array, it can be used in a wide range of applications, such as various flat panel displays, and the switching element has remarkable industrial value.

The present invention can realize production of an electron emitting element having a fine aggregate structure of a needle-like conductor (for example, nanowire and whiskers) simply at lower costs. Also, the electron emitting element obtained by a method of the present invention can be operated stably at a lower voltage, enables excellent image display (is reduced in the dispersion of qualities between pixels and provides good luminance gradation) and is therefore also widely applied to other electronic devices.

The present invention will be described in more detail based on the following examples, but the invention is not intended to be limited thereto.

EXAMPLES

Example 1

[Preparation of Fine-particle-placed Substrate 1]

Figure 23:
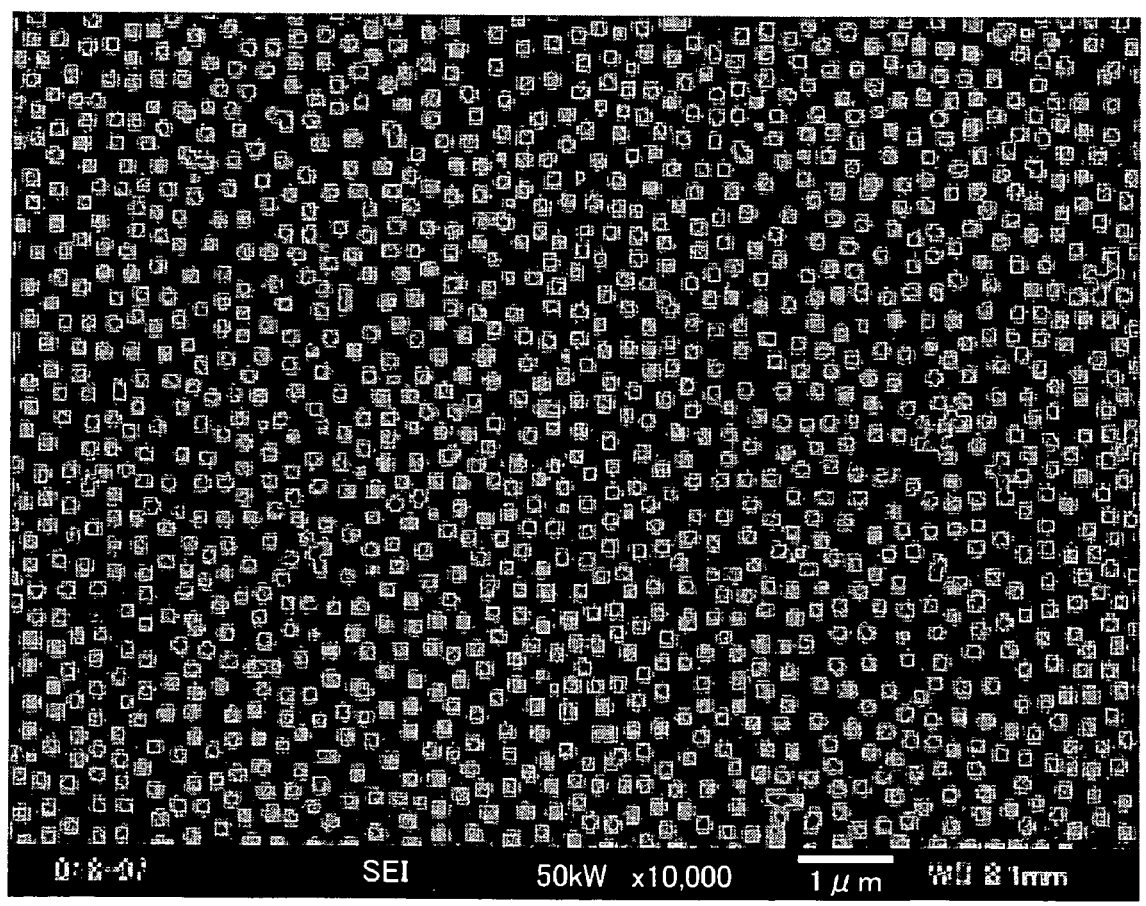
FIG. 23 is a microscopic photography showing a substrate provided with fine particles obtained in an example 1-1.

Polystyrene fine particles (Tg of bulky polystyrene is generally 100 to 110° C. and that of its particle surface is estimated approximately in a range of 70 to 80° C.) having the characteristics that the distribution of particle diameter was monodispersion, the coefficient of variation was 1.6%, the average particle diameter was 200 nm and a trimethylammonium group was provided to the surface thereof were used to prepare a dispersion liquid having a fine particle concentration of 8% by weight. This dispersion liquid was diluted with ultra-pure water into a 0.1 wt % dispersion liquid, which was then desalted by dialysis. A glass substrate washed with UV/$O_3$ was dipped in this dispersion liquid and allowed to stand at ambient temperature for 30 minutes. Then, the substrate was rinsed with boiled ultra-pure water (95° C.) for 30 seconds to carry out heat treatment, and further with ultra-pure water at ambient temperature for 30 seconds to cool. The substrate was pulled up from the ultra-pure water, excess water was removed by compressed air and then, the substrate was dried at ambient temperature under reduced pressure for 3 hours. Thus, a fine-particle-placed substrate 1 was prepared. The substrate was observed by an electron microscope to obtain an image which is shown in FIG. 23. This image was subjected to image analysis, to find that the domain density (on the assumption that when particles are respectively an independent particle, one particle is one domain, and when several particles are aggregated, this aggregate is one domain, the number of domains per unit area is calculated, and an increase in this number shows less aggregation) was 10/$\mu m^2$, the covering ratio (which is the ratio of the sum of the projected areas of domains (independent particles or particle aggregates) in a unit area, and an increase in this value shows that more particles are placed on the substrate) was 33%, and the average area per domain (which is obtained by dividing the sum of the projected areas of domains by the total number of domains, and as this value is closer to the projected area of independent particles, the aggregation is shown to be decreased) was 0.03 $\mu m^2$.

[Preparation of Fine-particle-placed Substrate 2]

Figure 24:
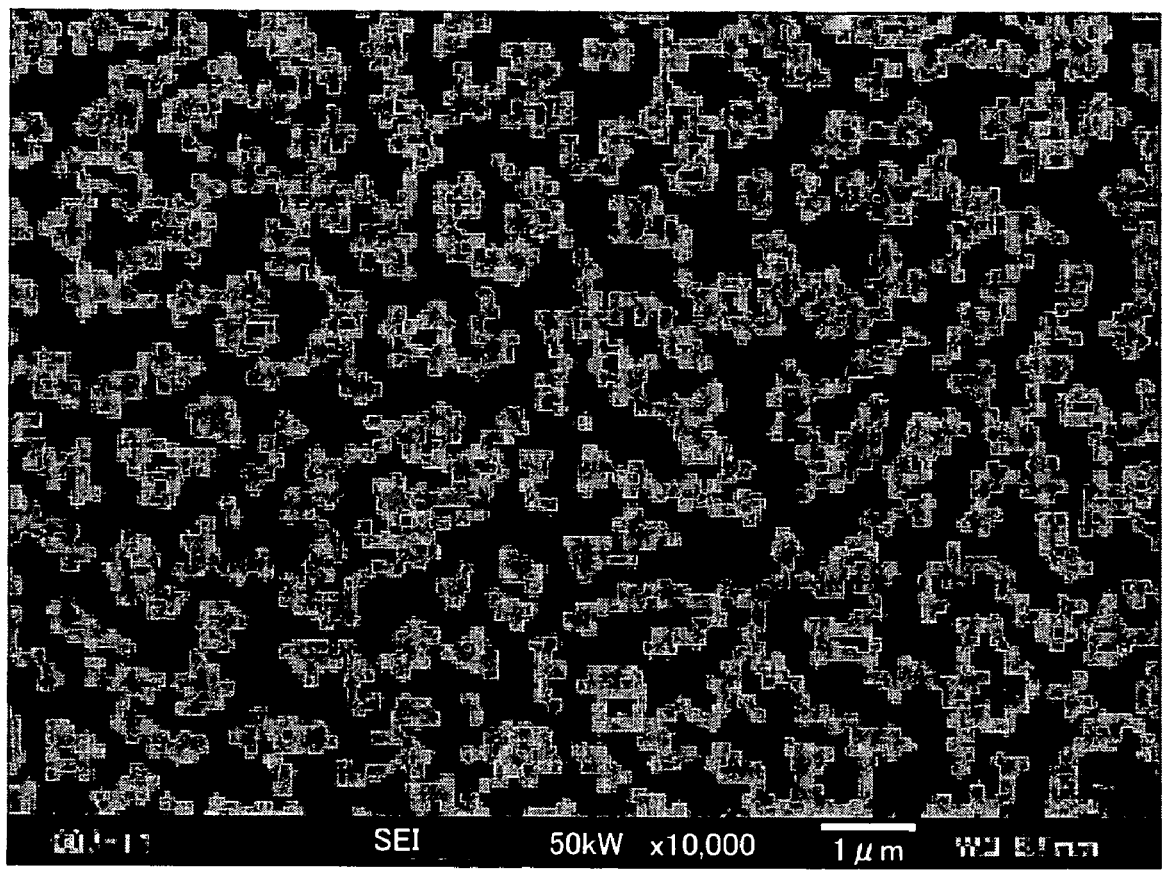
FIG. 24 is a microscopic photography showing a porous thin-film-deposition substrate obtained in an example 1-2.

Using the same fine particles, dispersion liquid, and substrate as the fine-particle-placed substrate 1, a fine-particle-placed substrate 2 was prepared in the same condition except that the heating treatment was not carried out. The condition of the fine particles on the substrate in this case is shown in FIG. 24. As is found in this figure coagulation of domains are observed. The results of image analysis are as follows: domain density: 1.2/$\mu m^2$, covering ratio: 34%, and average area per domain: 0.27 $\mu m^2$, and it was found from these results that the progress of coagulation was made.

[Preparation of Fine-particle-placed Substrate 3]

Figure 25:
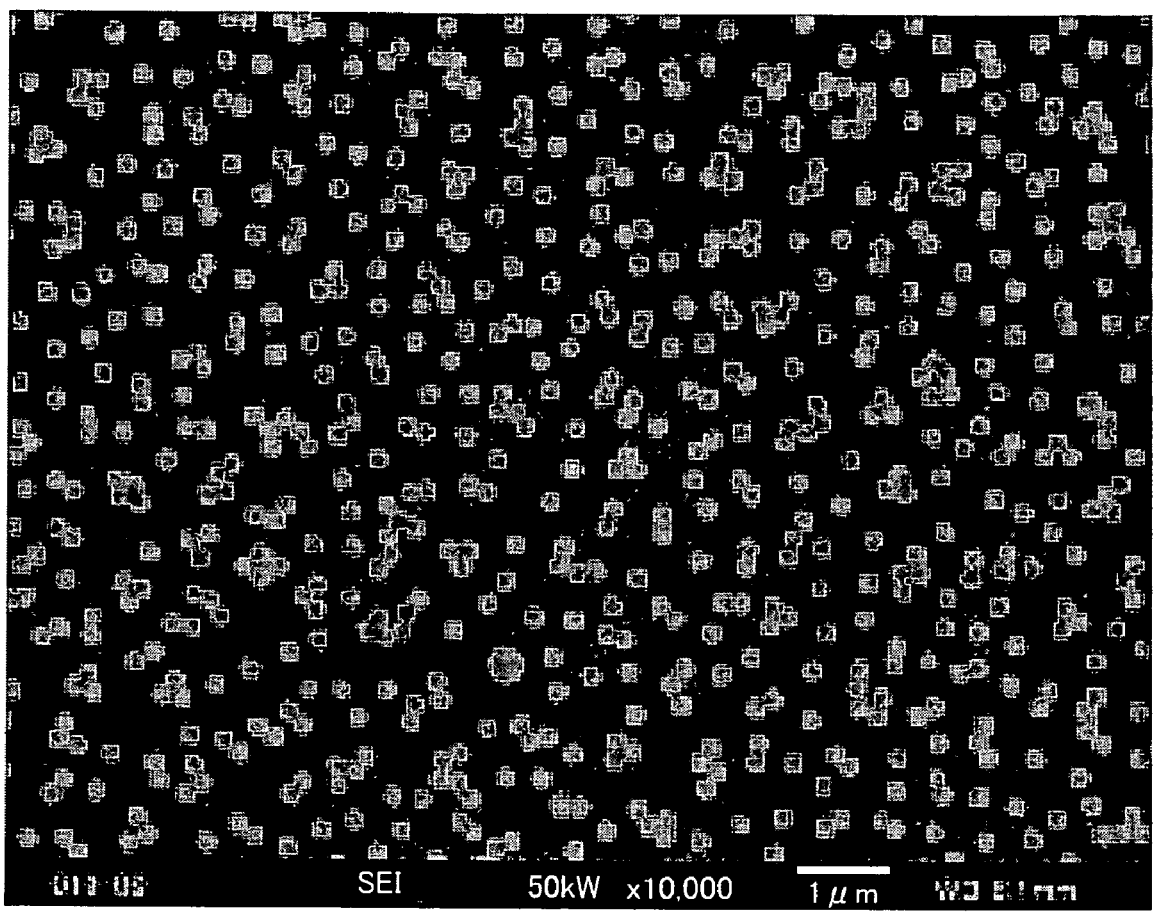
FIG. 25 is a microscopic photography showing a porous thin-film-deposition substrate obtained in an example 1-3.

A glass substrate treated with UV/$O_3$ was dipped in an aqueous 2% by weight of polydiallyldimethylammonium chloride (PDDA) solution for a fixed time, rinsed with ultra-pure water, and then dried at ambient temperature under reduced pressure for 3 hours. The contact angle of the substrate was measured before and after the substrate was treated with a cationic polymer, to find that the contact angle was changed from 40° to 50°, and it was thereby confirmed that a monomolecular layer of a cationic polymer was formed on the surface of the substrate. A dispersion liquid containing 10% by weight of polystyrene fine particles having a carboxyl group on the surface thereof, a coefficient of variation of 2.3% and average particle diameter of 200 nm was diluted with ultra-pure water into 0.1 wt % solution, which was then desalted by dialysis. A glass substrate to which PDDA was adsorbed was dipped in this solution and allowed to stand at ambient temperature for 30 minutes. Thereafter, the substrate was rinsed twice with 25° C. ultra-pure water for 30 seconds each time. The substrate was pulled up from the ultra-pure water and excess water was splashed by compressed air. Then, the substrate was dried under reduced pressure at ambient temperature for 3 hours. Thus, a fine-particle-placed substrate 3 was prepared. This substrate was observed by an electron microscope. The resulting image is shown in FIG. 25. This image was subjected to image analysis to obtain the following results: domain density: 3.5/$\mu m^2$, covering ratio: 20% and average area per domain: 0.06 $\mu m^2$.

[Production of Porous Thin-film-deposition Substrate 1]

Figure 26:
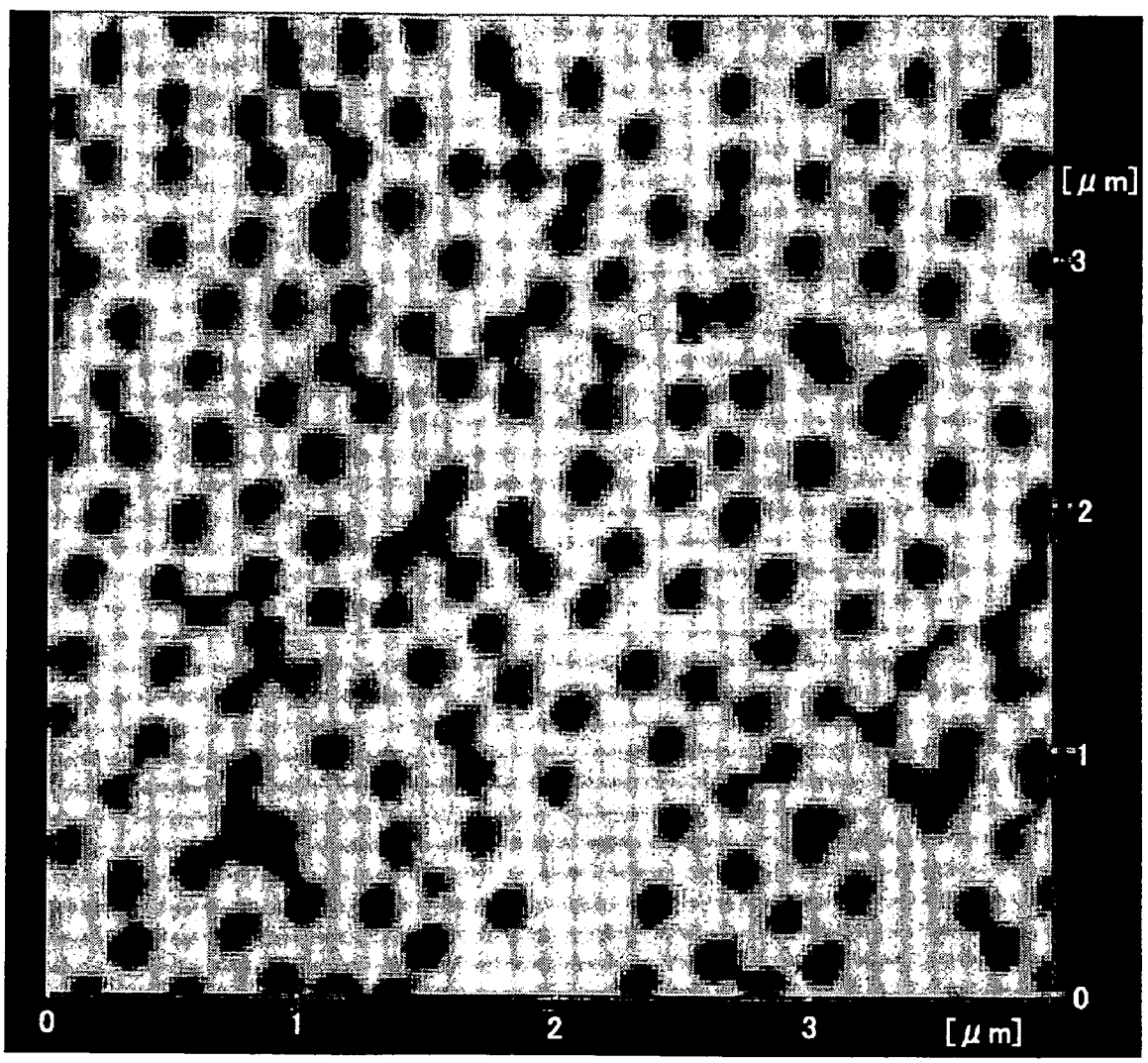
FIG. 26 is a microscopic photography showing a porous thin-film-deposition substrate obtained in an example 1-4.

Using the fine-particle-placed substrate 1, a porous thin-film-deposition substrate 1 was produced by a process shown in FIG. 2. A gold/chromium layer 26 nm in thickness was formed on the substrate 1 (Step I) on which fine particles 11 were disposed by RF (high frequency) sputtering to obtain a drain electrode 2 (step II). Next, a copper phthalocyanine layer (organic charge transferable material layer 5: step III) 23 nm in thickness and an aluminum layer (gate electrode 4: step IV) 20 nm in thickness were formed as films by vacuum deposition and laminated. Then, this substrate was irradiated with ultrasonic radiation in methanol to remove the particles. The degree of the removal of the fine particles was judged from a variation in the color of the laminate film, to find that the particles could be removed by ultrasonic radiation carried out for 15 minutes or more. FIG. 26 shows an inter-atomic microscopic (AFM) image on the surface of the substrate after the particles are removed. It was confirmed from the microscopic image that the particles were removed.

[Production of SIT(1-1)]

A copper phthalocyanine layer 200 nm in thickness was formed on the porous thin-film-deposition substrate 1 to obtain an organic charge transferable material layer and a metal layer 20 nm in thickness was further formed on the copper phthalocyanine layer and laminated as a source electrode to produce a SIT (1) element, which was named a SIT (1-1).

[Production of SIT(1-2)]

A SIT (1) was produced in the same manner as producing the porous thin-film-deposition substrate 1, except that the fine-particle-placed substrate 2 was used, which was named as a SIT (1-2).

[Production of SIT(C1) for Comparison]

Using the fine particles, dispersion liquid, and substrate same as those of the fine-particle-placed substrate 1, the fine particles were placed on the substrate by a spin coating method. The thus-obtained fine-particle-placed substrate C1 was evaluated in image analysis, and the results were as follows: domain density: $0.21/\mu m^2$, covering ratio: 15%, and average area per domain: $0.71 \mu m^2$. The amount of the placed particles was small and it was found that the progress of coagulation was remarkably made.

A SIT (1) was produced in the same manner as producing SIT(1-1), except that the fine-particle-placed substrate C1 was used, which was named as a SIT (C1).

[Switching Characteristics]

The characteristics of the SIT(1-1), SIT (1-2) and SIT (C1) as a switching element were investigated, to find that in the case of SIT(1-1), current density was $0.1/cm^2$ and the ON/OFF ratio ($I_{ON}/I_{OFF}$) between the source electrode and the drain electrode was $10^4$ or more when 2 V was applied across the source electrode and the drain electrode, whereas in the case of SIT(1-2), current density was $0.1 A/cm^2$ and the ON/OFF ratio ($I_{ON}/I_{OFF}$) between the source electrode and the drain electrode was $10^3$ or more when 5 V was applied across the source electrode and the drain electrode. This result shows that SIT (1-1) had a low operational voltage, was superior in the ON/OFF ratio and had therefore exhibited good switching characteristics. On the other hand, in the case of SIT (C1), the current density was $0.01 A/cm^2$ and the ON/OFF ratio ($I_{ON}/I_{OFF}$) between the source electrode and the drain electrode was $10^2$, when 5 V was applied across the source electrode and the drain electrode. This result shows that SIT (C1) was inferior in the switching characteristics.

Example 2

[Production of Porous Thin-film-deposition Substrate 2-1]

Using the fine-particle-placed substrate 1, thin films were formed in the procedures shown in FIG. 2. In specific, fine particles 11 were disposed on the substrate 1 (step I), to form a gold/chromium layer 20 nm in thickness which was to be a drain electrode 2 was formed by RF (high frequency) sputtering (step II). Next, a copper phthalocyanine layer 60 nm in thickness which was to be an organic charge transferable material layer 5 was formed by vacuum vapor deposition (organic charge transferable material layer 5: step III) and an aluminum layer 20 nm in thickness which was to be a gate electrode 4 was formed and laminated (step IV).

Thereafter, an adhesive sheet was applied to the surface of the substrate and was in close contact with the substrate by making a 1.7 kg rubber roller go and back once on the adhesive sheet and then, the adhesive sheet was turned up in a direction at about 180° with the substrate to peel off the adhesive sheet, thereby removing the fine particles. As the adhesive sheet, a mending tape (trade name: Scotch No. 2227HP, manufactured by Sumitomo 3M Ltd.) was used. The resulting porous thin-film-deposition substrate 2-1 was good as shown in the scanning electron microscopic (SEM) image of FIG. 27 in which neither fine particle residual nor breakdown of the thin film was seen.

[Production of Porous Thin-film-deposition Substrate 2-2]

Figure 27:
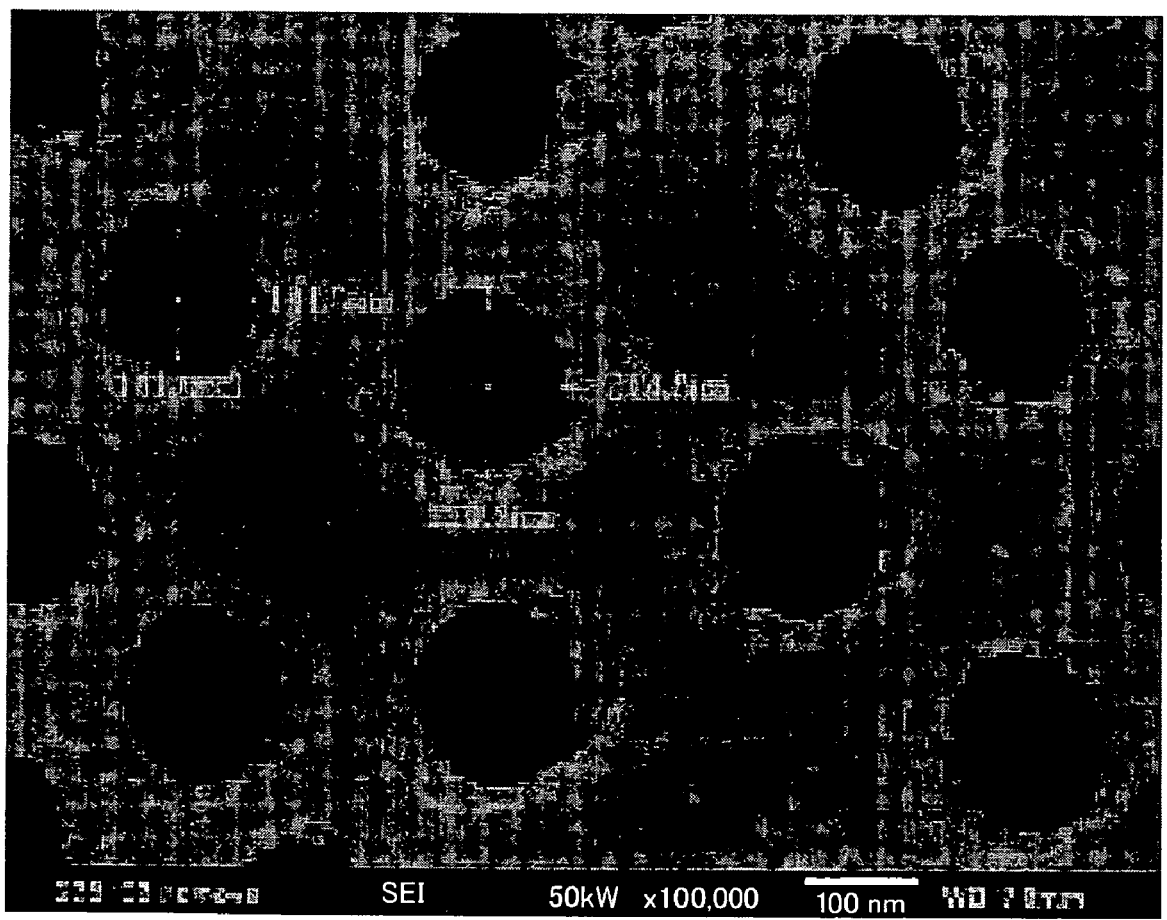
FIG. 27 is a microscopic photography showing a porous thin-film-deposition substrate obtained in an example 2-1-A.
Figure 28:
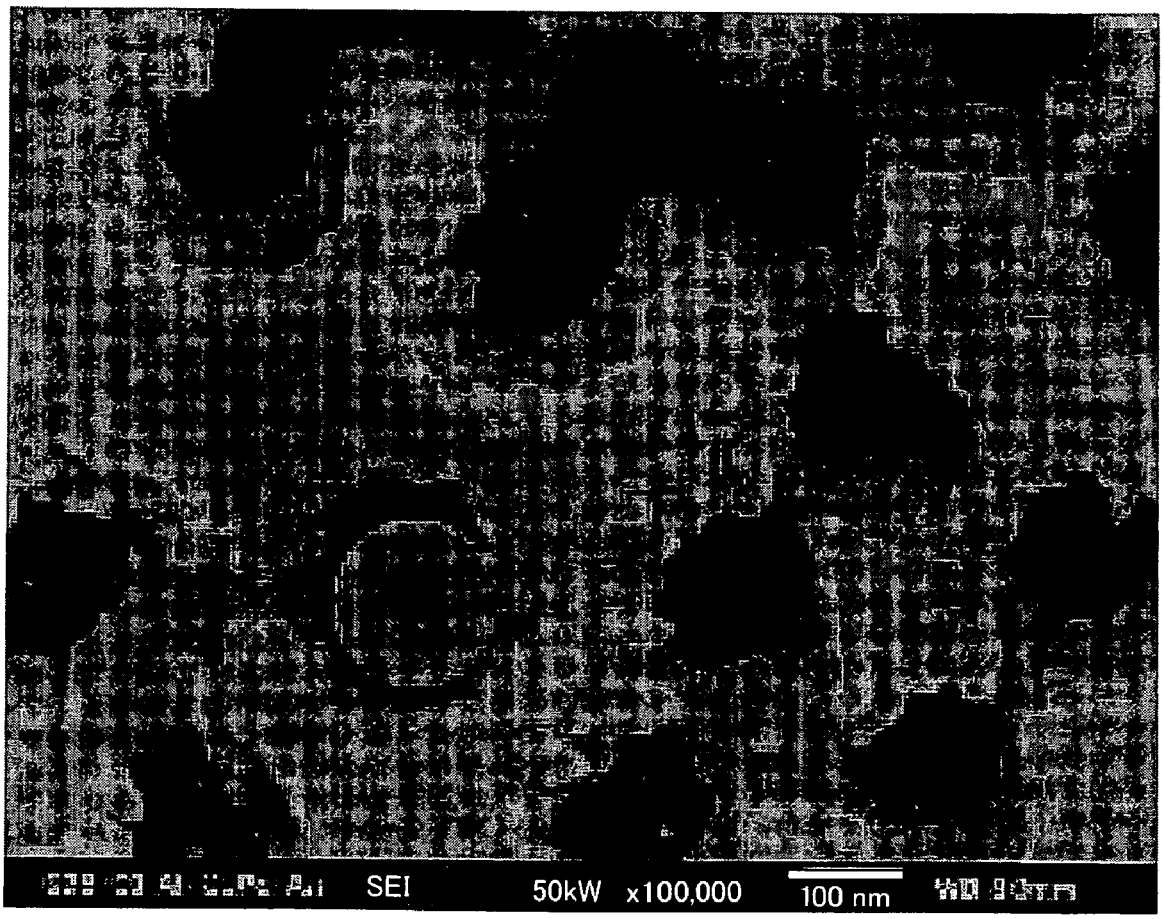
FIG. 28 is a microscopic photography showing a porous thin-film-deposition substrate obtained in an example 2-1-B.
Figure 29:
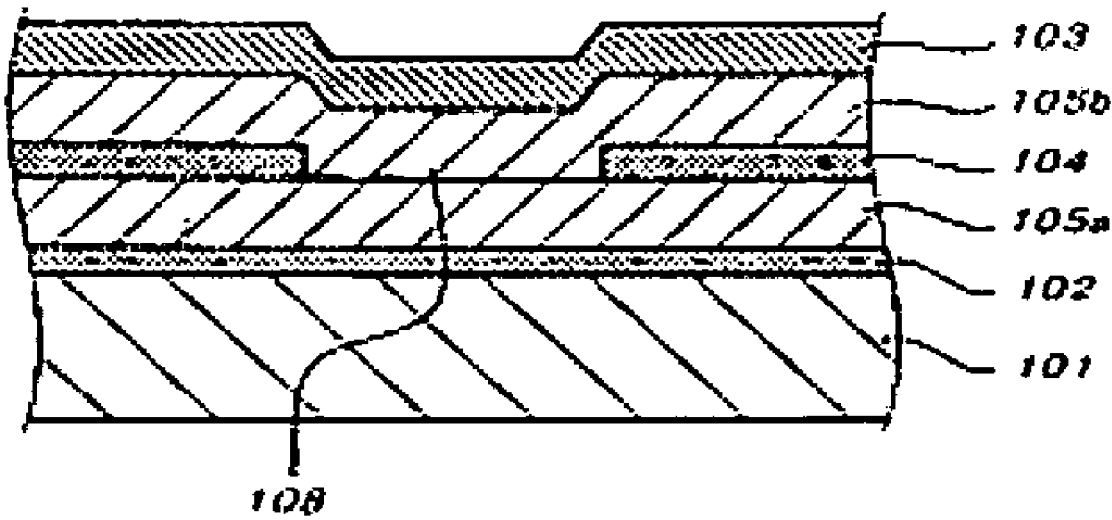
FIG. 29 is a partial sectional view schematically showing the structure of a conventional SIT.
Figure 30:
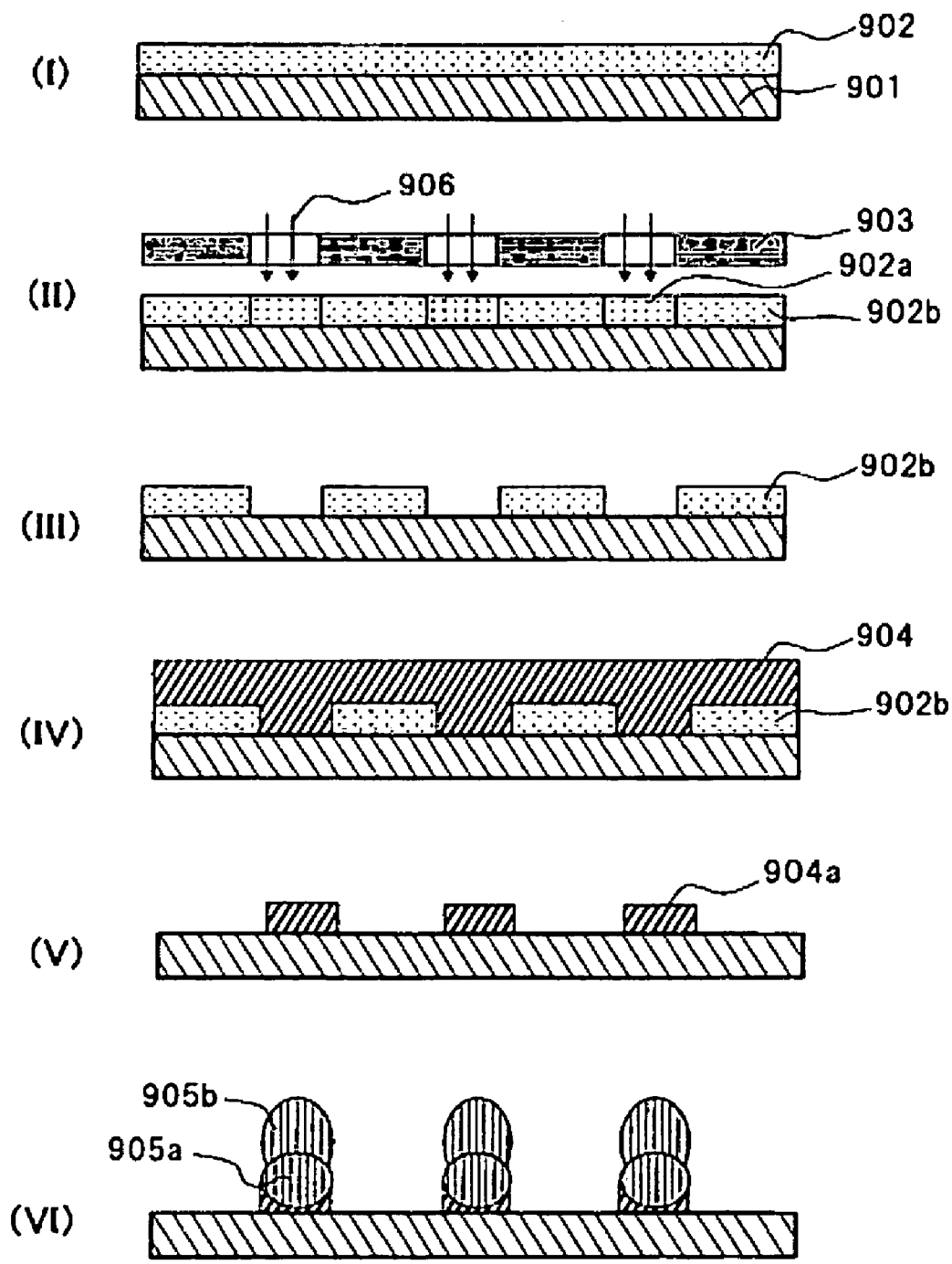
FIG. 30 is a typical view schematically showing a conventional photolithographic process.

A thin film was laminated on the fine-particle-placed substrate 1 in the same manner as producing the fine-particle-placed substrate 2-1. This thin film laminated substrate was subjected to ultrasonic radiation in methanol to remove the fine particles. The ultrasonic radiation was carried out at 33 kHz for 25 minutes while confirming the progress of removal of the fine particles by a variation in the color of the surface of the substrate. A scanning electron microscopic (SEM) image of the obtained porous thin film-deposition substrate 2-2 is shown in FIG. 28. As is understood from a comparison with FIG. 27, it was confirmed that in the substrate irradiated with ultrasonic wave for a long time, the fine particles were removed, and also there relatively confirmed more broken parts in the thin film laminate structure.

[Production of SIT(1-1a)]

A copper phthalocyanine layer 200 nm in thickness was formed on the porous thin-film-deposition substrate 2-1 by vacuum vapor deposition to form an organic charge transferable material layer, on which a metal 20 nm in thickness was formed as a source electrode to produce a SIT(1) element, which was named SIT(1-1a).

[Production of SIT(1-1b)]

A SIT(1) was produced in the same manner as producing SIT(1-1a), except that the porous thin-film-deposition substrate 2-2 was used, which was named as SIT(1-1b).

[Switching Characteristics]

The characteristics of SIT(1-1a) and SIT(1-1b) as switching elements were examined, to find that, when 2 V was applied across the source electrode and the drain electrode, SIT(1-1a) had a current density of $0.1 A/cm^2$, the ON/OFF ratio ($I_{ON}/I_{OFF}$) of source electrode-drain electrode current was $10^4$ or more and no short circuit was developed across the gate electrode and the drain electrode, exhibiting good results. On the other hand, when 5 V was applied, SIT(1-1b) had a current density of $0.1 A/cm^2$, the ON/OFF ratio ($I_{ON}/I_{OFF}$) of source electrode-drain electrode current was $10$ or more and a short circuit was developed across a part of the gate electrode and the drain electrode. It was therefore understood that SIT(1-1a) was relatively a good element, because it was reduced in operational voltage, it was superior in the ON/OFF ratio, and it had good switching characteristics and developed no short circuit across electrodes.

[Production of Various Porous Thin-film-deposition Substrates]

In order to investigate the influence of an adhesive sheet, besides the porous thin-film-deposition substrate 2-1, porous thin-film-deposition substrates produced in the same manner except that different adhesive sheets were used, to confirm the state of residual fine particles and the state of damages to the thin film. The results of the porous thin-film-deposition substrate 2-1 were shown as Test No. 1 and the others were shown as Tests No. 2 to No. 5 in Table 1.

TABLE 1

| Examination | Model Number | Manufacturer | Flexibility[1] | Irregularities of the substrate[2] | Adhesive strength[3] | Remaining fine particles[4] | Damages to the thin film[5] |
|---|---|---|---|---|---|---|---|
| No. 1 | Scotch 2227HP | Sumitomo 3M Ltd. | Soft | Smooth | 0.7 N/25 mm | Very good | Very good |
| No. 2 | Elep Masking Tape N-380 | Nitto Denko Corp. | Soft | Smooth | 0.98 N/20 mm | Fair | Very good |
| No. 3 | Scotch NO. 851T | Sumitomo 3M Ltd. | Hard | Smooth | 2.74 N/cm | Good | Very good |
| No. 4 | Scotch NO. 214-3MNE | Sumitomo 3M Ltd. | Soft | Irregular | 2.59 N/cm | Fair | Very good |
| No. 5 | Scotch NO. 810 | Sumitomo 3M Ltd. | Hard | Irregular | 7 N/cm | Very good | Fair |

[1]Flexibility: The flexibility of an adhesive sheet was divided by extension and the adhesive sheet having an extension of 50% or more was defined as "soft" and an adhesive sheet having an extension less than 50% was defined as "hard".
[2]Irregularities of the substrate: The smoothness of the surface of a substrate was differentiated visually and a substrate in which no irregularity was observed was defined as "smooth" and a substrate in which irregularities were observed was defined as "irregular".
[3]Adhesive strength: The adhesive strength measured according to JIS Z-0237 is shown.
[4]Remaining fine particles: Regions where fine particles were left on the substrate were confirmed by an optical microscopic image, and the cases where the area in which the fine particles were left in an optionally selected region of 100 μm × 100 μm was less than 1%, 1% to 5%, and 5% or more were defined as "very good", "good", and "fair" respectively.
[5]Damages to the thin film: Damages such as peeling of the thin film were confirmed by an electron microscopic image and the cases where the damages were at about a level as shown in FIG. 27 and at about a level as shown in FIG. 28 were defined as "very good" and "fair" respectively.

It was found from this results that the substrate was preferably one having flexibility and smoothness.

In the case of Test No. 1 which was 2227HP which used a flexible polyolefin type film as the substrate, to which an acryl type adhesive was applied and had moderate adhesive force (corresponds almost to 0.7 N/cm, though the measuring unit of adhesive force is different), the particles could be removed almost perfectly.

In the case of Test No. 2 that was the adhesive sheet N380 which used a vinyl chloride substrate, was soft and smooth and had low adhesive force (assumed to have lower adhesive force from a feel to the touch as compared with the above 2227HP, though the measuring unit of adhesive force is different), residual fine particles were seen.

In the case of Test No. 3 that was No. 851T which used a relatively hard polyester film as the substrate, a trace of residual fine particles were generated.

In the case of Test No. 4 that was No. 214-3MNE (rubber type adhesive) which used crepe paper as the substrate and was therefore soft but had large irregularities, so that the adhesive incompletely adhered to the substrate and there were therefore many residual fine particles.

In the case of No. 5 that was No. 810 (acetate film substrate, acryl type adhesive) which had been subjected to matt processing and there was therefore the case where particles remained along this matted shape. Also, a film was peeled off from the undercoat layer (thin films around the fine particles).

The characteristics of the porous thin-film-deposition substrate 2-2 (the porous thin-film-deposition substrate produced by removing the fine particles by ultrasonic means) were confirmed in the same manner as above, and as a result, the evaluation of the fine particle residue was "fair" and the evaluation of the damages to the thin film was "fair".

Example 3

[Preparation of Fine-particle-placed Substrate]

Chromium about 1 nm in thickness was deposited as an undercoat layer 102 on a glass substrate 101 about 0.7 mm in thickness by sputtering. Tantalum about 100 nm in thickness was deposited as a cathode electrode 103 on the chromium. Nickel about 20 nm in thickness was deposited as a catalyst metal 104 on the tantalum (steps Ia and Ib in FIG. 19).

In succession, fine particles 105 which were to be a shadow mask were provided on the catalyst metal 104 by using the following method. As the fine particles, monodisperse polystyrene fine particles to the surface of which a carboxyl group was added and which had a particle diameter of 1 μm and a coefficient of variation of 3% were used. A dispersion liquid of the fine particles was adjusted to a concentration of 0.1% by weight and subjected to dialysis. The substrate was dipped in this dispersion liquid at ambient temperature for 30 minutes. Then, the substrate was rinsed with boiled ultra-pure water for 30 seconds and then with ultra-pure water at ambient temperature for 30 seconds. After that, the substrate was dried under reduced pressure for 3 hours to obtain a fine-particle-placed substrate in which the fine particles 105 were secured to the catalyst layer 104 (steps IIa and IIb in FIG. 19).

[Production of Porous Thin-film-deposition Substrate]

Silica (SiO$_2$) about 400 nm in thickness was deposited as an insulation layer 106 on the above-obtained fine-particle-placed substrate by sputtering. Thereafter, tantalum about 100 nm in thickness was deposited as a gate electrode 107 on the insulation layer 106 (steps IIIa and IIIb in FIG. 19)

Then, the particles were removed by an adhesive tape to form an opening part 108. After that, the substrate was washed with acetone and then with ultra-pure water to remove the residues of the mask particles and adhesive tape.

Fine pores of the porous thin film-deposition substrate had an average opening diameter of 1.3 μm and an opening ratio of 37%, wherein the coefficient of variation of the opening diameter was 7%.

[Production of Electron Emitting Element]

In succession, carbon nanotubes were selectively grown on the catalyst metal 104 exposed from the bottom of the opening part 108 to form a needle-like conductor group 109 in the following procedures. A plasma was discharged using a ultrasonic wave for 30 minutes in hydrogen gas under 3 Torr with applying a d.c. negative bias voltage of about 140 V to the cathode electrode 103 on the substrate 101 to thereby etch the surface of the catalyst metal 104. Next, a plasma was discharged using a ultrasonic wave for 5 minutes in a mixed gas of hydrogen and methane (4:1) under a total pressure of 3 Torr with applying a d.c. negative bias voltage of about 185 V to the cathode electrode 103 on the substrate to thereby allow the carbon nanotubes to selectively grow on the surface of the catalyst metal 104. The needle-like conductor group (emitter) 109 formed here had an average height of about 300 nm and a diameter of about 5 nm to 20 nm. The needle-like conductor 109 was thus secured to the catalyst layer 104 (FIG. 20).

The thus-obtained electron emitting element of the present invention had fine pores having uniform shapes and a needle-shaped conductor group that was regularly arranged.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. 119 (a) on Patent Application No. 2005-271184 filed in Japan on Sep. 16, 2005, Patent Application No. 2005-271190 filed in Japan on Sep. 16, 2005, Patent Application No. 2005-271192 filed in Japan on Sep. 16, 2005, Patent Application No. 2005-252450 filed in Japan on Aug. 31, 2005, Patent Application No. 2005-252513 filed in Japan on Aug. 31, 2005, Patent Application No. 2005-252518 filed in Japan on Aug. 31, 2005, which are herein incorporated by reference.

What we claim is:

1. A method of producing a porous thin-film-deposition substrate, comprising:
    placing, onto a substrate that has an electrostatic charge on its surface, fine particles with a surface electrostatic charge opposite to the electrostatic charge of the substrate surface,
    depositing a thin film, including at least one layer, on the fine-particle-placed substrate,
    sticking an adhesive sheet on the fine-particle-placed substrate with the thin film deposited thereon, wherein an adhesive strength of the adhesive sheet is 0.1 N/cm to 5 N/cm, and then
    peeling the adhesive sheet for removing the fine particles to form fine pores in the thin film on the substrate.

2. The method of producing a porous thin-film-deposition substrate according to claim 1, comprising heating to soften the fine particles for adhering and fixing the particles on the substrate.

3. The method of producing a porous thin-film-deposition substrate according to claim 1, wherein the fine particles are polymer fine particles.

4. The method of producing a porous thin-film-deposition substrate according to claim 1, wherein an average opening diameter of the pores of the thin film is 1 nm to 10 µm.

5. The method of producing a porous thin-film-deposition substrate according to claim 1, wherein the surface of the substrate is modified by a surface modifier.

6. A porous thin-film-deposition substrate produced in accordance with the method of claim 1.

7. A switching element, comprising: the porous thin-film-deposition substrate of claim 6, and another thin film formed on the porous thin-film-deposition substrate.

8. The switching element according to claim 7, wherein at least one layer of the thin films is a layer of an organic charge-transferable material.

9. The method of producing a porous thin-film-deposition substrate according to claim 1, wherein an adhesive plane of the adhesive sheet is smooth.

10. The method of producing a porous thin-film-deposition substrate according to claim 1, wherein the adhesive sheet is flexible.

11. The method of producing a porous thin-film-deposition substrate according to claim 1, wherein the thin film contains at least one organic semiconductor layer.

12. A method of producing an electron emitting element, comprising:
    adding a catalyst metal on a substrate,
    placing fine particles onto the catalyst-added substrate,
    depositing a thin film, including at least one layer, on the fine-particle-placed substrate, then
    removing the fine particles to form fine pores in the film, and
    growing needle-shaped conductors as an aggregate thereof on the catalyst metal that is exposed on a bottom face of the fine pore.

13. The method of producing an electron emitting element according to claim 12, wherein an average opening diameter of the fine pores is 1 nm to 10 µm.

14. The method of producing an electron emitting element according to claim 12, wherein the coefficient of variation of the opening ratio of the fine pores is 50% or less.

15. The method of producing an electron emitting element according to claim 12, wherein at least one electrode layer is formed under the catalyst metal.

16. The method of producing an electron emitting element according to claim 12, wherein an insulation layer and an electrode layer are included in the thin film.

17. The method of producing an electron emitting element according to claim 12, wherein a dipping adsorption method is used to provide the fine particles onto the substrate.

18. The method of producing an electron emitting element according to claim 12, wherein the needle-shaped conductor is a whisker obtained by growing carbon nanotubes.

19. A display element, comprising the electron emitting element produced in accordance with the method of claim 12.

20. An electron emitting element, comprising:
    a substrate with at least one layer of a base film formed thereon,
    another thin film layer, formed on the base film, having fine pores arranged substantially at an equal interval, and
    an aggregate of needle-shaped conductors formed on each bottom face of the fine pores;
    wherein the fine pores of the film layer are formed by removing fine particles from the substrate, in that the fine particles are once placed onto the surface of the base film on the substrate in accordance with a dipping adsorption method, and then the film layer is deposited on the fine-particle-placed substrate;
    the electron emitting element further comprising a catalyst metal to be exposed at the bottom face of the fine pores after the fine particles are removed, and needle-shaped conductors grown on the catalyst metal.

21. The electron emitting element according to claim 20, wherein the base film includes:
    an electrode layer sharing its surface to be the bottom face of the fine pores, or
    an electrode layer under a layer sharing its surface to be said bottom face; and
    an insulation layer positioned under the electrode layer.

22. The electron emitting element according to claim 20, wherein an average opening diameter of the fine pores is 1 nm to 10 µm.

23. The electron emitting element according to claim 20, wherein the needle-shaped conductor is made of a carbon nanotube.

24. A display element comprising the electron emitting element according to claim 20.

* * * * *